US011853552B2

(12) United States Patent
Ryan et al.

(10) Patent No.: US 11,853,552 B2
(45) Date of Patent: Dec. 26, 2023

(54) HYBRID MEMORY DEVICE USING DIFFERENT TYPES OF CAPACITORS

(71) Applicant: Micron Technology, Inc., Boise, ID (US)

(72) Inventors: Kevin J. Ryan, Eagle, ID (US); Kirk D. Prall, Boise, ID (US); Durai Vishak Nirmal Ramaswamy, Boise, ID (US); Robert Quinn, Campbell, CA (US)

(73) Assignee: Micron Technology, Inc., Boise, ID (US)

( * ) Notice: Subject to any disclaimer, the term of this patent is extended or adjusted under 35 U.S.C. 154(b) by 95 days.

(21) Appl. No.: 17/374,359

(22) Filed: Jul. 13, 2021

(65) Prior Publication Data

US 2021/0405884 A1  Dec. 30, 2021

Related U.S. Application Data

(62) Division of application No. 16/358,219, filed on Mar. 19, 2019, now Pat. No. 11,068,166, which is a
(Continued)

(51) Int. Cl.
*G06F 3/06* (2006.01)
*G11C 11/404* (2006.01)
(Continued)

(52) U.S. Cl.
CPC ............ *G06F 3/0611* (2013.01); *G06F 3/068* (2013.01); *G06F 3/0625* (2013.01);
(Continued)

(58) Field of Classification Search
CPC .. G11C 11/005; G11C 11/221; G11C 11/2259; G11C 11/404; G11C 11/4096;
(Continued)

(56) References Cited

U.S. PATENT DOCUMENTS 5,455,786 A  10/1995  Takeuchi et al.
5,539,279 A   7/1996  Takeuchi et al.
(Continued)

FOREIGN PATENT DOCUMENTS

CN       1512509 A    7/2004
CN     102057440 A    5/2011
(Continued)

OTHER PUBLICATIONS

Huan et al., "Pathways towards ferroelectricity in hafnia", Physical Review B 90, Aug. 27, 2014, 5 pgs., 2014 American Physical Society.
(Continued)

*Primary Examiner* — Jerome Leboeuf
(74) *Attorney, Agent, or Firm* — Holland & Hart LLP

(57) ABSTRACT

The hybrid memory device may include volatile and non-volatile memory cells on a single substrate, or die. The non-volatile memory cells may have ferroelectric capacitors and the volatile memory cells may have paraelectric or linear dielectric capacitors for their respective logic storage components. In some examples, the volatile memory cells may be used as a cache for the non-volatile memory cells. Or the non-volatile memory cells may be used as a back-up for the volatile memory cells. By placing both types of cells on a single die, rather than separate dies, various performance metrics may be improved, including those related to power consumption and operation speed.

19 Claims, 17 Drawing Sheets

Related U.S. Application Data division of application No. 15/252,886, filed on Aug. 31, 2016, now Pat. No. 10,282,108.

(51) Int. Cl.

| | |
|---|---|
| *G11C 11/00* | (2006.01) |
| *H10B 12/00* | (2023.01) |
| *H10B 53/30* | (2023.01) |
| *G11C 11/22* | (2006.01) |
| *G11C 11/4096* | (2006.01) |
| *G11C 14/00* | (2006.01) |
| *H01L 23/528* | (2006.01) |
| *H01L 49/02* | (2006.01) |

(52) U.S. Cl.
CPC .......... *G06F 3/0626* (2013.01); *G06F 3/0647* (2013.01); *G06F 3/0653* (2013.01); *G06F 3/0659* (2013.01); *G11C 11/005* (2013.01); *G11C 11/221* (2013.01); *G11C 11/2259* (2013.01); *G11C 11/404* (2013.01); *G11C 11/4096* (2013.01); *G11C 14/0027* (2013.01); *H01L 23/528* (2013.01); *H01L 28/55* (2013.01); *H10B 12/03* (2023.02); *H10B 12/30* (2023.02); *H10B 53/30* (2023.02); *G11C 11/2273* (2013.01); *G11C 2207/2245* (2013.01)

(58) Field of Classification Search
CPC ............ G11C 14/0027; G11C 11/2273; G11C 2207/2245; H01L 23/528; H01L 28/55; H10B 12/03; H10B 12/30; H10B 53/30; H10B 12/33; H10B 12/0335; H10B 12/373

See application file for complete search history.

(56) References Cited

U.S. PATENT DOCUMENTS

| | | | |
|---|---|---|---|
| 5,615,145 | A | 3/1997 | Takeuchi et al. |
| 5,986,301 | A | 11/1999 | Fukushima et al. |
| 6,410,397 | B1 | 6/2002 | Ochiai et al. |
| 6,441,415 | B1 | 8/2002 | Moise et al. |
| 6,898,105 | B2 | 5/2005 | Sakai et al. |
| 7,050,322 | B2 | 5/2006 | Zambrano |
| 7,709,359 | B2 | 5/2010 | Boescke et al. |
| 7,791,149 | B2 | 9/2010 | Boescke |
| 8,304,823 | B2 | 11/2012 | Boescke |
| 8,445,883 | B2 | 5/2013 | Himeno et al. |
| 8,896,096 | B2 | 11/2014 | Tu et al. |
| 9,514,797 | B1 | 12/2016 | Chu et al. |
| 9,697,882 | B1 | 7/2017 | Evans, Jr. et al. |
| 2002/0066921 | A1 | 6/2002 | Sitaram et al. |
| 2003/0142533 | A1* | 7/2003 | Ueda ............ H10B 53/00 257/E29.302 |
| 2003/0147269 | A1 | 8/2003 | Nishihara |
| 2003/0174531 | A1 | 9/2003 | Zambrano |
| 2004/0125641 | A1 | 7/2004 | Kang |
| 2007/0194360 | A1 | 8/2007 | Kang |
| 2009/0026514 | A1 | 1/2009 | Wang |
| 2009/0321801 | A1 | 12/2009 | Hayashi et al. |
| 2010/0110753 | A1 | 5/2010 | Slesazeck et al. |
| 2010/0127316 | A1 | 5/2010 | Tu et al. |
| 2010/0302849 | A1 | 12/2010 | Jung et al. |
| 2011/0220861 | A1 | 9/2011 | Himeno et al. |
| 2015/0016175 | A1 | 1/2015 | Evans et al. |
| 2015/0199126 | A1 | 7/2015 | Jayasena et al. |
| 2015/0311217 | A1 | 10/2015 | Chavan et al. |
| 2016/0064391 | A1* | 3/2016 | Li ............ H10B 53/30 257/295 |
| 2016/0126245 | A1 | 5/2016 | Liu et al. |
| 2018/0059976 | A1 | 3/2018 | Helmick et al. |

FOREIGN PATENT DOCUMENTS

| | | |
|---|---|---|
| EP | 1202333 A2 | 5/2002 |
| JP | H06215589 A | 8/1994 |
| JP | H0721784 A | 1/1995 |
| JP | 09-102191 A | 4/1997 |
| JP | H09139480 A | 5/1997 |
| JP | 11-354727 A | 12/1999 |
| JP | 2000187989 A | 7/2000 |
| JP | 2003228977 A | 8/2003 |
| JP | 2009076912 A | 4/2009 |
| JP | 2017518632 A | 7/2017 |
| KR | 20150091892 A | 8/2015 |
| WO | 2008131058 A2 | 10/2008 |
| WO | 2015167887 A1 | 11/2015 |

OTHER PUBLICATIONS

Kim et al., "Examination on the ferroelectric properties and reliability of HfxZr1—xO.sub.2 films on Ir substrates", WCU Hybrid Materials Program, Department of Material Science & Engineering and Inter-university Semiconductor Research Center, Seoul nation University, Seoul 151-744, Korea, 2 pgs. English Abstract Only.

Kim et al., "Lattice contraction and cation ordering of ZrTiO.sub.4 in the normal-to-incommensurate phase transition", Journal of Applied Physics 89, Jun. 1, 2001, 8 pgs., vol. 89 No. 11, 2001 American Institute of Physics.

Knebel et al., "Conduction Mechanisms and Breakdown Characteristics of AlsO3-Doped ZrO.sub.2 High-k Dielectrics for Three-Dimensional Stacked Metal-Insulator-Metal Capacitors", IEEE Transactions on Device and Materials Reliability, Jun. 11, 2012, pp. 154-160, vol. 14, Issue 1, IEEE.

Liu et al., "Effect of Ti incorporation on the interfacial and optical properties of HfTiO thin films", Journal of Applied Physics 108, Jul. 16, 2010, 4 pgs., 2010 American Institute of Physics.

Lomenzo et al., "Ferroelectric phenomena in Si-doped HfO.sub.2 thin films with TiN and Ir electrodes", Journal of Vacuum Science and Technology B 32, Apr. 25, 2014, 9 pgs. 2014 American Vacuum Society.

Lomenzo et al., "Ferroelectric Si-Doped HfO.sub.2 Device Properties on Highly Doped Germanium", IEEE Electron Device Letters, Aug. 2005, pp. 766-768, vol. 36, Issue 8, IEEE.

Lomenzo et al., "TaN interface properties and electric field cycling effects on ferroelectric Si-doped HfO.sub.2 thin films", Journal of Applied Physics 117, Apr. 6, 2015, 11 pgs., 2015 AIP Publishing LLC.

Lomenzo et al., "The effects of layering in ferroelectric Si-doped HfO.sub.2 thin films", Applied Physics Letters 105, Aug. 21, 2014, 6 pgs., 2014 AIP Publishing LLC.

Lucovsky, "Spectroscopic Studies of Electrically Active Defects in High-K Gate Dielectrics", Defects in Microelectronic Materials and Devices, pp. 305-340, CRC Press Taylor & Francis Group.

Martin et al., "Downscaling ferroelectric field effect transistors by using ferroelectric Si-doped HfO.sub.2", 2012 13th International Conference on Ultimate Integration on Silicon, Mar. 6-7, 2012, pp. 195-198, IEEE.

McAdams et al., "A 64-Mb embedded FRAM utilizing a 130-nm 5LM Cu/FSG logic process", IEEE Journal of Solid-State Circuits, Apr. 2004, pp. 667-677, vol. 39, Issue 4, IEEE.

Mueler et al., "Reliability Characteristics of Ferroelectric Si:HfO.sub.2 Thin Films for Memory Applications", IEEE Transactions on Device and Materials Reliability, Mar. 2013, pp. 93-97, vol. 13, No. 1, IEEE.

Mueller et al., "From MFM Capacitors Toward Ferroelectric Transistors: Endurance and Disturb Characteristics of HfO.sub.2-Based FeFET Devices", IEEE Transactions on Electron Devices, Dec. 2013, pp. 4199-4205, vol. 60, Issue 12, IEEE.

Mueller et al., "Incipient Ferroelectricity in Al-Doped HfO.sub.2 Thin Films", Advanced Functional Materials, 2012, 6 pgs. .COPYRGT. 2012 Wiloey-VCH Verlag GmbH & Co. KGaA, Weinheim.

Mueller et al., "Ten-Nanometer Ferroelectric Si:HfO.sub.2 Films for Next-Generation FRAM Capacitors", IEEE Electron Device Letters, Jul. 24, 2012, pp. 1300-1302, vol. 33, Issue 9, IEEE.

(56) References Cited

OTHER PUBLICATIONS

Muller et al., "Applicability of Ferroelectric HfO.sub.2 for Non-Volatile Memory-Cell Arrays", 1 pg.
Muller et al., "Charge trapping in Si:HfO.sub.2-based ferroelectric field effect transistors: A fast transient characterization using pulsed I.sub d-V.sub.g methodology", 1 pg.
Muller et al., "Ferroelectric Zr0.5Hf0.5O.sub.2 thin films for non-volatile memory applications", Applied Physics Letters 99, Sep. 19, 2011, 4 pgs., 2011 American Institute of Physics.
Muller et al., "Ferroelectricity in Simple Binary ZrO.sub.2 and HfO.sub.2", Nano Letters, Jul. 19, 2012, 6 pgs. .COPYRGT. American Chemical Society.
Muller et al., "Ferroelectricity in yttrium-doped hafnium oxide", Journal of Applied Physics 110, Dec. 7, 2011, 6 pgs. 2011 American Institute of Physics.
Muller et al., "Improved manufacturability of ZrO.sub.2 MIM capacitors by process stabilizing HfO.sub.2 addition", Elsevier Microelectronic Engineering Journal, Mar. 1, 2009, 4 pgs. 2009 Elsevier B.V.
Muller et al., "Nanosecond Polarization Switching and Long Retention in a Novel MFIS-FET Based on Ferroelectric HfO.sub.2", IEEE Electron Device Letters, Feb. 2012, pp. 185-187, vol. 33, Issue 2, IEEE.
Muller et al., "Scaling and Optimization of Ferroelectric Hafnium Oxide for Memory Applications and Beyond", Extended Abstracts of the 2015 International Conference on Solid State Devices and Materials, pp. 1150-1151, Sapporo, 2015.
Muller et al., Ferroelectricity in HfO.sub.2 enables nonvolatile data storage in 28 nm HKMG, VLSI Technology 2012 Symposium, Jun. 12-14, 2012, pp. 25-26, IEEE.
Next Generation Ferroelectric Field Effect Transistors enabled by Ferroelectric Hafnium Oxide SEMICON Europa 2015, PE 2015, Powerpoint pp. 1-30.
Olsen et al., "Co-sputtering yttrium into hafnium oxide thin films to produce ferroelectric properties" Applied Physics Letters 101, Aug. 22, 2012, 5 pgs., 2012 American Institute of Physics.
Park et al., "Effect of forming gas annealing on the ferroelectric properties of Hf0.5Zr0.5O.sub.2 thin films with and without Pt electrodes", Applied Physics Letters 102, Mar. 22, 2013, 5 pgs., 2013 American Institute of Physics.
Park et al., "Evolution of phases and ferroelectric properties of thin Hf0.5Zr0.5O.sub.2 films according to the thickness and annealing temperature", Applied Physics Letters 102, Jun. 18, 2013, 6 pgs., 2013 AIP Publishing LLC.
Park et al., "Study on the degradation mechanism of the ferroelectric properties of thin Hf0.5Zr0.5O.sub.2 films on Tin and Ir electrodes", Applied Physics Letters 105, Aug. 18, 2014, 6 pgs., 2014 AIP Publishing LLC.
Park et al., "The effects of crystallographic orientation and strain of thin Hf0.5Zr0.5O.sub.2 film on its ferroelectricity", Applied Physics Letters 104, Feb. 18, 2014, 6 pgs., 2014 AIP Publishing LLC.
Park et al., "The effects of grain size on the electrical properties of ferroelectric Hf1—xZrxO.sub.2 thin films", WCU Hybrid Materials Program, Department of Material Science and Engineering and Inter-university Semiconductor Research Center, Seoul National University, Seoul 151-744, Korea, 2 pgs.
Park et al., "Thin HfxZr1—xO.sub.2 Films: A New Lead-Free System for Electrostatic Supercapacitors with Large Energy Storage Density and Robust Thermal Stability", Advanced Energy Materials, 2014, 7 pgs. .COPYRGT. 2014 Wiley-VCH Verlag GmbH & Co. KGaA, Weinheim.
Chinese Patent Office, "Office Action", issued in connection with Chinese Patent Application No. 201780052714.9 dated Nov. 23, 2022 (10 pages) (13 pages of English Translation and 10 pages of Original Document).
Boscke et al., "Ferroelectricity in hafnium oxide thin films", Applied Physics Letters 99, Sep. 8, 2011, 4 pgs., 2011 American Institute of Physics.

Pesic et al., "Modeling of Charge Trapping influence on the Ferroelectric Switching Behavior of Doped HfO.sub.2", EMRS 2015 Lille, Dec. 5, 2015, 23 pgs., namlab.
Pitcher et al., "Energy Crossovers in Nanocrystalline Zirconia", Journal of the American Ceramic Society 88, Jan. 2005, 8 pgs., vol. 88, No. 1.
Polakowski et al., "Ferroelectric deep trench capacitors based on Al:HfO.sub.2 for 3D nonvolatile memory Applications", 2014 IEEE 6th International Memory Workshop, May 18-21, 2014, pp. 1-4, IEEE.
Robertson et al., "Defect Energy Levels in HfO.sub.2 and Related High-K Gate Oxides", Defects in Microelectronic Materials and Devices, pp. 283-303, CRC Press Taylor & Francis Group.
Sang et al., "On the structural origins of ferroelectricity in HfO.sub.2 thin films", Applied Physics Letters 106, Apr. 23, 2015, 5 pgs., 2015 AIP Publishing LLC.
Schenk et al., "Complex Internal Bias Fields in Ferroelectric Hafnium Oxide", ACS Applied Materials & Interfaces, Aug. 26, 2015, pp. 20224-20233, ACS Appl. Mater Interfaces 2015.
Schenk et al., "Electric Field Cycling Behavior of Ferroelectric Hafnium Oxide", Applied Materials & Interfaces, 8 pgs., .COPYRGT. 2014 American Chemical Society.
Schenk et al., "Strontium Doped Hafnium Oxide Thin Films: Wide Process Window for Ferroelectric Memories", 2013 Proceedings of the European Solid-State Device Research Conference (ESSDERC), Sep. 16-20, 2013, pp. 260-263, IEEE.
Schroeder et al., "Hafnium Oxide Based CMOS Compatible Ferroelectric Materials", ECS Journal of Solids State Science and Technology, Honolulu, Hawaii, Meeting of the Society, Oct. 7-12, 2012, 4 pgs., 2013 The Electrochemical Society.
Schroeder et al., "Non-Volatile data storage in highly scaled hafnium oxide based ferroelectric FETs", IWCMM, Agrate, Oct. 3, 2014, 40 pgs., namlab.
Schroeder, "Non-Volatile data storage in 28nm ferroelectric FET", Jun. 25, 2012, WODIM, Dresden, 34 pgs., namlab.
Scott et al., "Polarons, oxygen vacancies, and hydrogen in BaxSr1—xTiO3", Journal of the European Ceramic Society 21 (2001), pp. 1629-1632, COPYRGT. 2001 Elsevier Science Ltd.
Shih et al., "Ultra-Low Switching Energy, Excellent Endurance & Long Retention Single MOSFET-DRAM", 3 pgs.
Shimizu et al., "Contribution of oxygen vacancies to the ferroelectric behavior of Hf0.5Zr0.5O.sub.2 thin films", Applied Physics Letters 106, Mar. 18, 2015, 6 pgs. 2015 AIP Publishing LLC.
Sun et al., "A Study of ferroelectric HfO.sub.2 for emerging memory technology", Yale University, 2015, 3 pgs.
T.P. Ma, "FEDRAM: A Capacitor-less DRAM Based on Ferroelectric-Gated MOSFET", Yale University, Presentation, 41 pgs.
Tomida et al., "Dielectric constant enhancement due to Si incorporation into HfO.sub.2", Applied Physics Letters 89, Oct. 2, 2006, 4 pgs. 2006 American Institute of Physics.
Yurchuk et al. "Origin of the Endurance Degradation in the Novel HfO sub.2-based 1T Ferroelectric Non-Volatile Memories", 2014 IEEE International Reliability Physics Symposium, Jun. 1-5, 2014, pp. 2E.5.1-2E.5.5, 2014 IEEE.
Yurchuk et al., "Impact of Scaling on the Performance of HfO.sub.2-Based Ferroelectric Field Effect Transistors", IEEE Transactions on Electron Devices, Nov. 2014, pp. 3699-3706, vol. 61, Issue 11, IEEE.
Zhou et al., "Insights into electrical characteristics of silicon doped hafnium oxide ferroelectric thin films." Applied Physics Letters 100, Feb. 22, 2012, 5 pgs., 2012 American Institue of Physics.
Zhou et al., "Wake-up effects in Si-doped hafnium oxide ferroelectric thin films", Applied Physics Letters 103, Nov. 5, 2013, 5 pgs., 2013 AIP Publishing LLC.
European Patent Office, "Office Action," issued in connection with European Patent Application No. 17847226.2, dated Mar. 23, 2021 (5 pages).
European Patent Office, "Supplemental European Search Report," issued in connection with European Patent Application No. 17847226, dated Jan. 30, 2020 (7 pages).
IPO, "Office Action," issued in connection with ROC (Taiwan) Patent Application No. 108119281, dated Jun. 30, 2020 (10 pages).

(56) References Cited

OTHER PUBLICATIONS

IPO, Office Action, issued in connection with ROC (Taiwan) Patent Application No. 106129581, dated Mar. 27, 2018 (8 pages).
ISA/KR, International Search Report and Written Opinion of the International Searching Authority, Int'l. Appl. No. PCT/US2017/047787, dated Nov. 28, 2017, Korean Intellectual Property Office, Seo-gu, Daejeon, Republic of Korea, 12 pgs.
JPO, "Notice of Rejection Grounds," issued in connection with Japanese Patent Application No. 2019-511355, dated Jun. 2, 2020 (12 pages).
The Korean Intellectual Property Office, "Notice of Reasons for Rejection," issued in connection with Korean Patent Application No. 10-2019-7008700, dated Mar. 31, 2020 (8 pages).
Taiwanese Patent Office, "Office Action and Search Report", , issued in connection with Taiwanese Patent Application No. 110105515, dated Dec. 23, 2021, 15 (pages).
Boscke et al., "Ferroelectricity in Hafnium Oxide: CMOS compatible Ferroelectric Field Effect Transistors", Electron Devices Meeting (IEDM) 2011, Dec. 5-7, 2011, 4 pgs. IEEE.
Boscke et al., "Phase transitions in ferroelectric silicon doped hafnium oxide", Applied Physics Letters 99, Sep. 15, 2011, 4 pgs., 2011 American Institute of Physics.
Chen et al., "First principles calculations of oxygen vacancy passivation by fluorine in hafnium oxide", Applied Physics Letters 89, Oct. 12, 2006, 4 pgs. 2006 American Institute of Physics.
Cheng et al., "Low-Leakage-Current DRAM-Like Memory Using a One-Transistor Ferroelectric MOSFET With a Hf-Based Gate Dielectric", IEEE Electron Device Letters, Jan. 2014, pp. 138-140, vol. 35, Issue 1, IEEE.
Cisneros-Morales et al., "Intrinsic metastability of orthorhombic HfTiO4 in thin films hafnia-titania", Applied Physics Letters 98, Jan. 31, 2011, 4 pgs. 2011 American Institute of Physics.
Clima et al., "Identification of the ferroelectric switching process and dopant-dependent switching properties in orthorhombic HfO.sub.2: A first principles insight", Applied Physics Letters 104, Mar. 5, 2014, 5 pgs., 2014 AIP Publishing LLC.
Copel et al., "Structure and stability of ultrathin zirconium oxide layers on Si(001)", Applied Physics Letters, Jan. 24, 2000, pp. 436-438, vol. 76, Issue 4, 2000 American Institute of Physics.
Dr Wolfgang Schartl, "Basic Physical Chemistry: A Complete Introduction on Bachelor of Science Level", 1st Edition, 166 pages, COPYRGT. 2014 Dr. Wolfgang Schartl & bookboon.com.
Driemeier et al., "Thermochemical behavior of hydrogen in hafnium silicate films on Si", Applied Physics Letters 89, Aug. 4, 2006, 4 pgs., 2006 American Institute of Physics.
Fischer et al., "Stabilization of the High-k tetragonal phase in HfO.sub.2: The influence of dopants and temperature from ab initio simulations", Journal of Applied Physics 104, Oct. 21, 2008, 7 pgs., 2008 American Institute of Physics.
Funakubo et al., "Effect of Oxygen Partial Pressure under Heat Treatment on Ferroelectricity of (Hf0.5Zr0.5)O.sub.2 Thin Films", Extended Abstracts of the 2014 International Conference on Solid State Devices and Materials, pp. 436-437, Tsukuba, 2014.
Funakubo et al., "Effect of Stress on Ferroelectricity of (Hf0.5Zr0.5)O.sub.2 Thin Films", Extended Abstracts of the 2015 International Conference on Solid State Devices and Materials, pp. 1152-1153, Sapporo, 2015.
Haggerty, "The High Temperature Structural Evolution of Hafnia", Dissertation, 2011, 167 pgs., .COPYRGT. 2011 Ryan Paul Haggerty.
Hoffman et al., "Ferroelectric phase transitions in nanoscale HfO.sub.2 films enable giant pyroelectric energy conversion and highly efficient supercapacitors", Nano Energy (2015), 11 pgs.
Hoffman et al., "Stabilizing the ferroelectric phase in doped hafnium oxide", Journal of Applied Physics 118, Aug. 19, 2015, 10 pgs., 2015 AIP Publishing LLC.
Pesic et al., "Impact of charge trapping on the ferroelectric switching behavior of doped HfO.sub.2", Phys. Status Solidi A, 1-4 (2015), Oct. 27, 2015, 5 pgs., 2015 Wiley-VCH Verlag GmbH & Co. KGaA, Weinheim.

\* cited by examiner

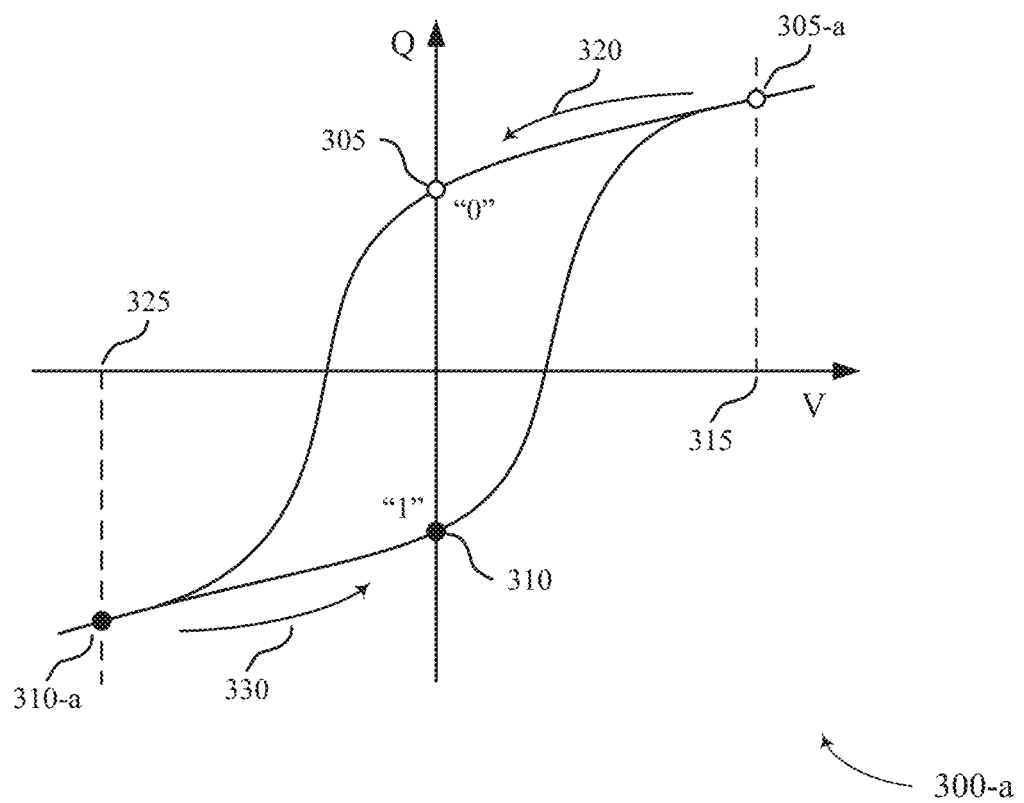
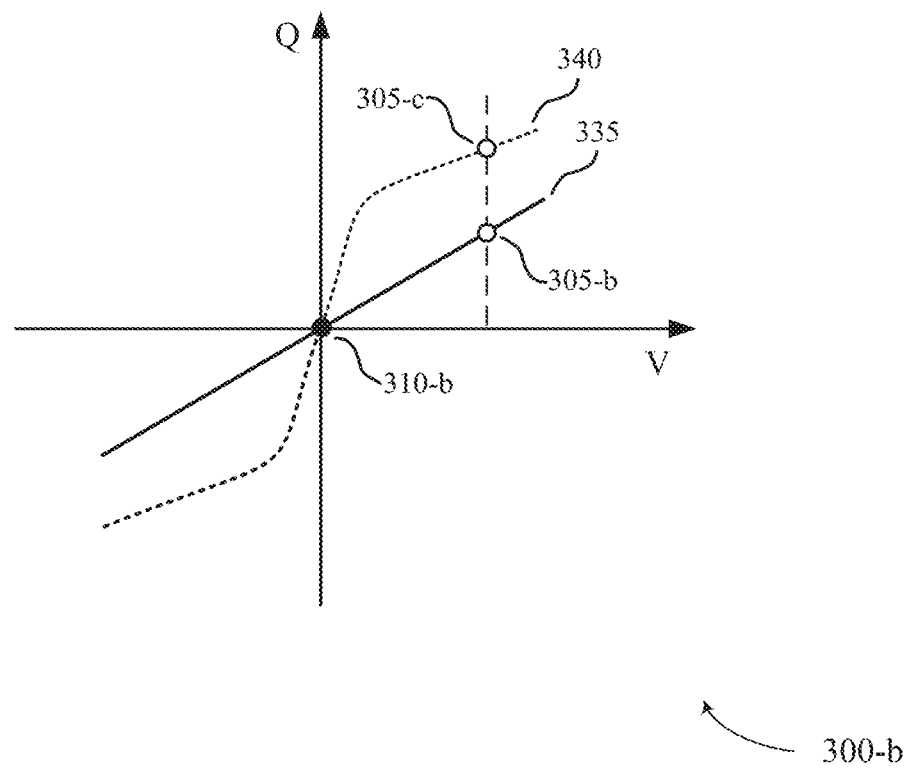
FIG. 3

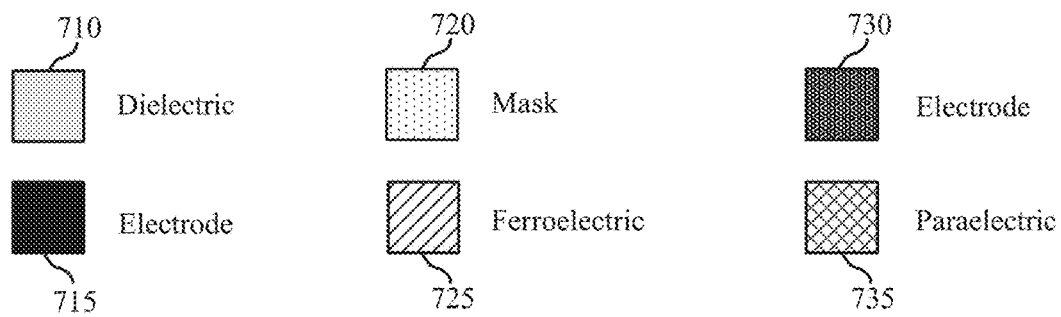
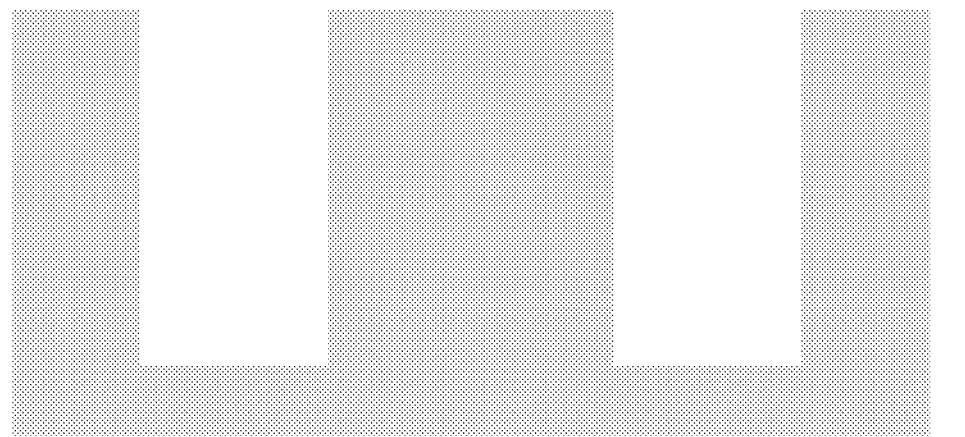
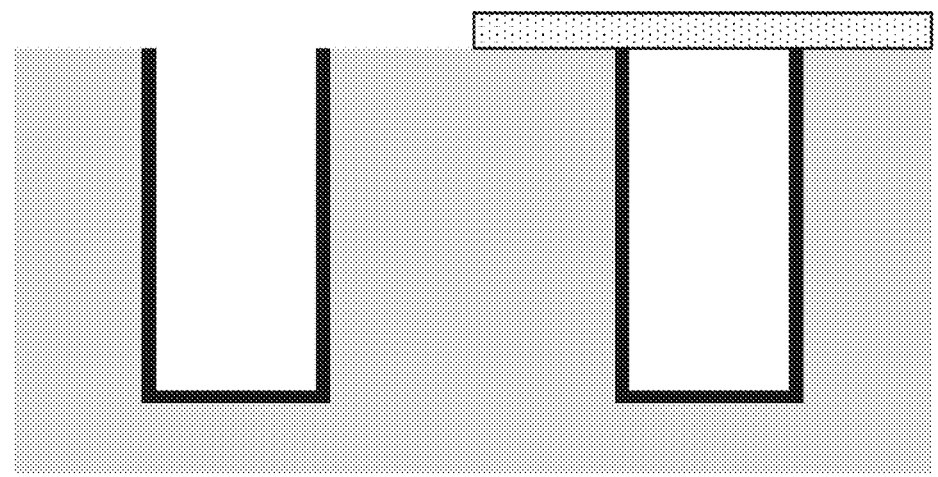
FIG. 7A

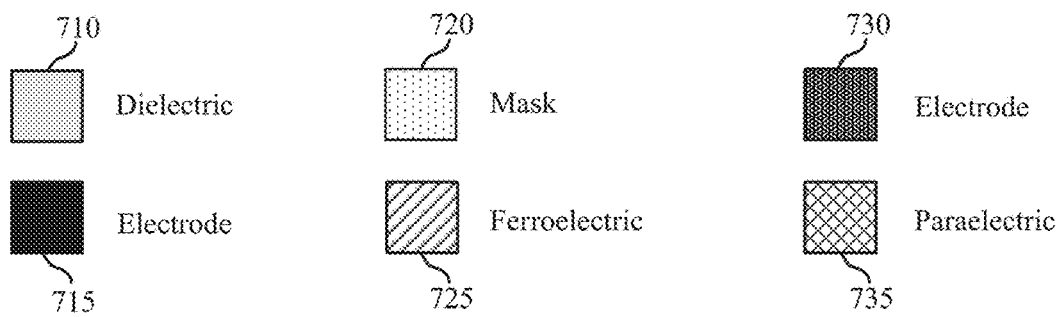
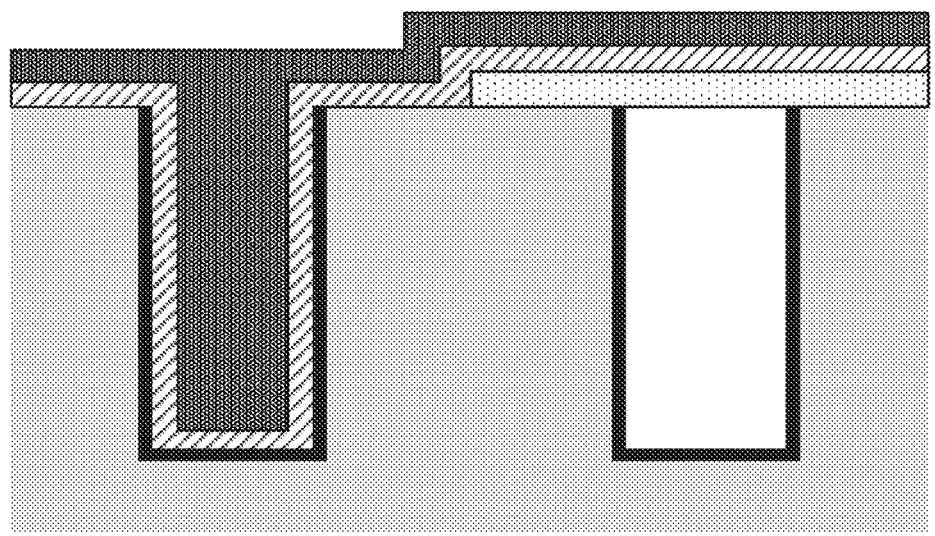
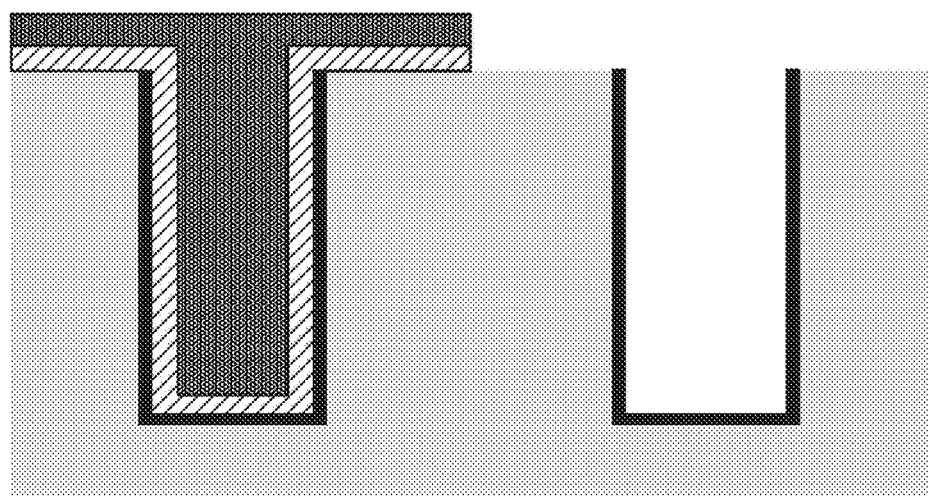
FIG. 7B

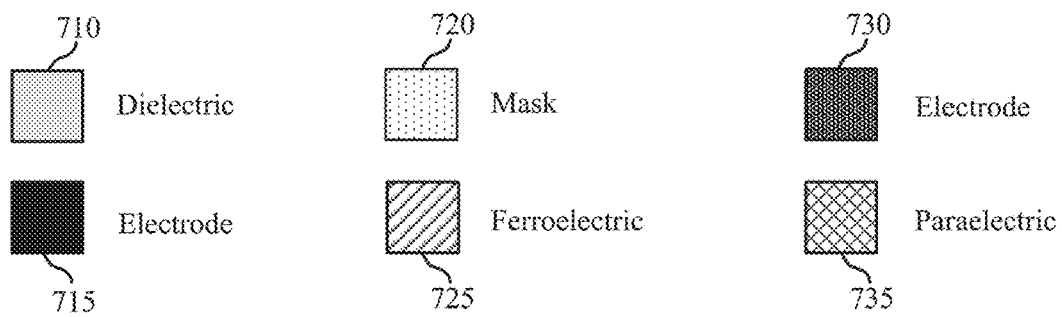
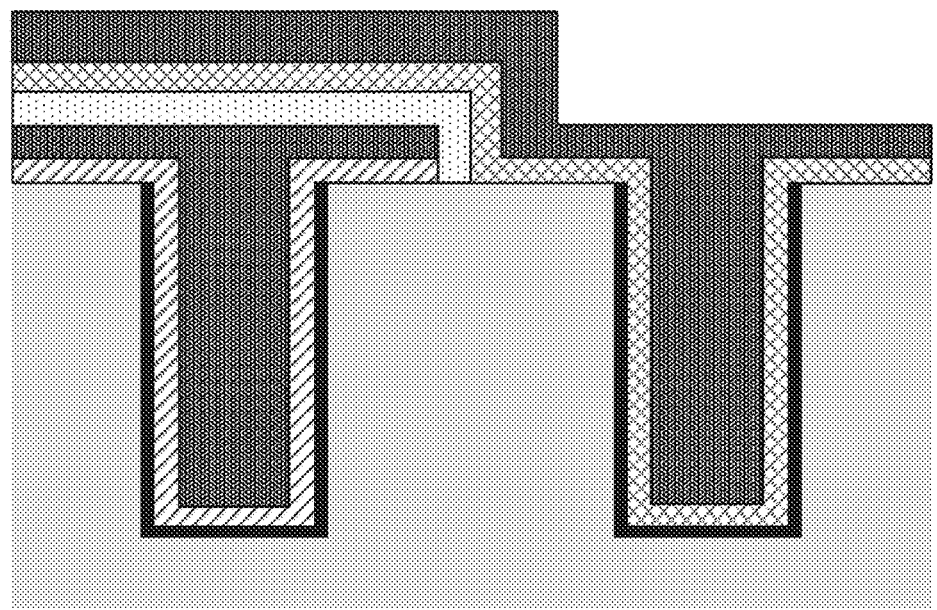
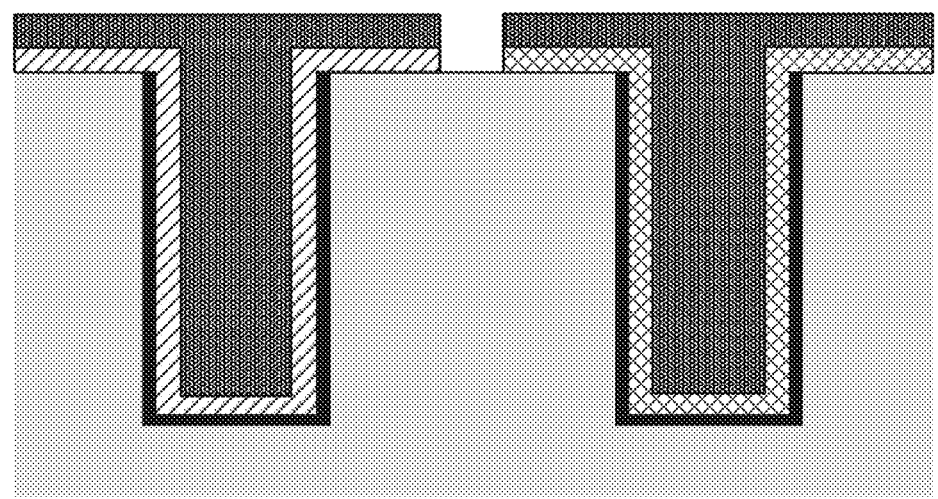
FIG. 7C

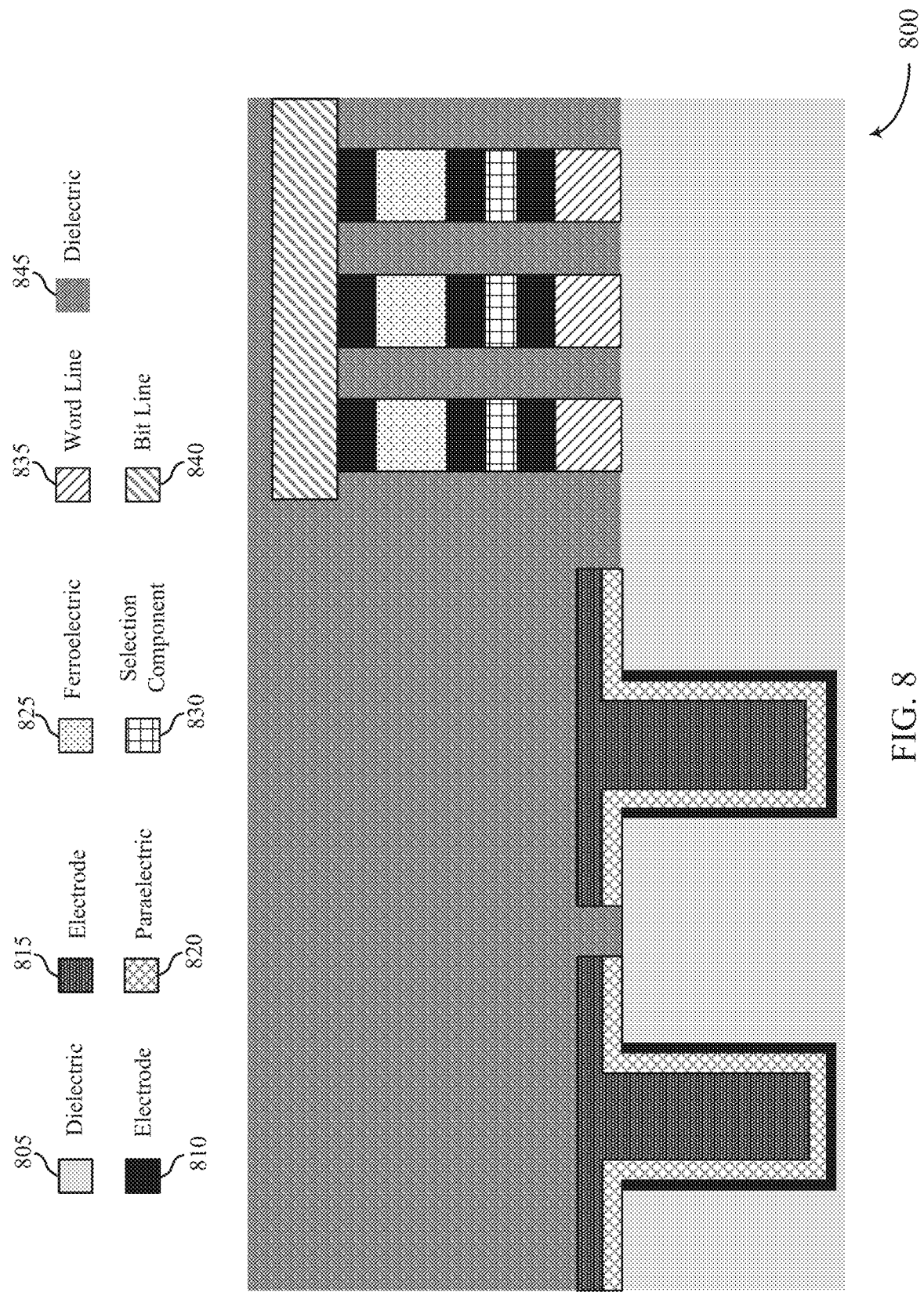

HYBRID MEMORY DEVICE USING DIFFERENT TYPES OF CAPACITORS

CROSS REFERENCE

The present application for patent is a divisional of U.S. patent application Ser. No. 16/358,219 by Ryan et al., entitled "A Hybrid Memory Device," filed Mar. 19, 2019, which is a divisional of and claims priority to and the benefit of U.S. patent application Ser. No. 15/252,886 by Ryan et al., entitled "A Hybrid Memory Device," filed Aug. 31, 2016, assigned to the assignee hereof, and each of which is expressly incorporated by reference in its entirety herein.

BACKGROUND

The following relates generally to memory devices and more specifically to a hybrid memory device.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may, however, offer performance advantages, such as faster read or write speeds, while features of non-volatile memory, such as the ability to store data without periodic refreshing, may be advantageous.

A determination whether to employ volatile or non-volatile memory is often specific to the application of the electronic device using the memory device. Due to the relative benefits and drawbacks of each type, choosing one memory type over the other may result in reduced performance in at least one metric or characteristic. This may ultimately limit the performance of the electronic device.

BRIEF DESCRIPTION OF THE DRAWINGS

The disclosure herein refers to and includes the following figures:

FIG. 3 illustrates example hysteresis plots for a ferroelectric memory cell supported by a hybrid memory device in accordance with various embodiments of the present disclosure;

FIGS. 7A-7C illustrate an example process flow for forming a hybrid memory device in accordance with various embodiments of the present disclosure;

FIG. 8 illustrates an example process flow for forming a hybrid memory device in accordance with various embodiments of the present disclosure;

DETAILED DESCRIPTION

Figure 1:
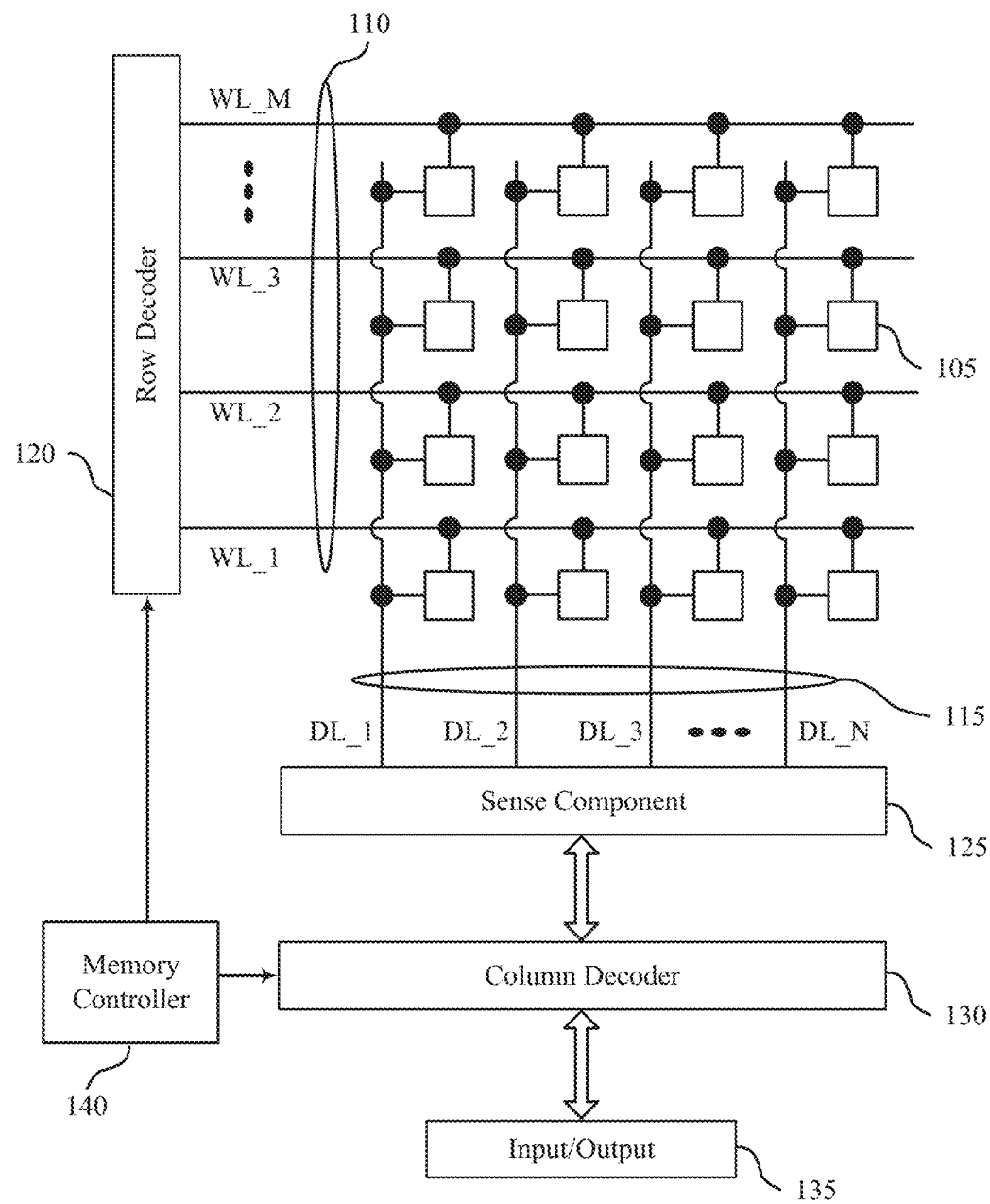
FIG. 1 illustrates an example memory array that supports a hybrid memory device in accordance with various embodiments of the present disclosure.

A hybrid memory device that combines volatile and non-volatile memory cells on a single substrate, or die, is disclosed. The hybrid device may have the beneficial attributes of both memory technologies: fast read and write operations typical of volatile memory cells coupled with long-term storage of non-volatile memory cells. By forming both types on a single die, rather than separate dies, or even within the same memory array, various performance metrics may be improved, including reduced latency of data transfers between the two memory types, reduced power requirements, and reduced area of the memory device, all of which may be relevant for many electronic devices, including power- and space-sensitive devices, such as mobile devices.

Hybrid memory devices may include volatile memory cells (e.g., DRAM with paraelectric capacitors) and non-volatile memory cells (e.g., FeRAM with ferroelectric capacitors). DRAM may have improved performance compared to FeRAM, including latency (access speed), endurance (maximum number of accesses), active power, or raw bit error rate. DRAM, however, is volatile and requires refresh processes and a constant power supply, while FeRAM may not have refresh requirement. Thus, by combining DRAM and FeRAM, a memory device may combine the positive attributes of both.

Combining both memory types on a single die offers further benefits. A die may be defined as the individual piece of semiconducting material on which the electronic circuits that constitute the memory array are formed. A single semiconductor wafer may result in multiple dies, where the wafer is cut into the individual dies after processing. Thus, one processing flow may result in a single die with multiple memory types formed on the die, which may be less expensive to produce than two separate dies, each with a different memory type. Further, this may result in a reduced area compared to using separate DRAM and FeRAM dies. Also, a hybrid memory device may have reduced latency compared to separate memory dies because moving information between memory cells on a single die may be faster than moving information to a second die through various interfaces, components, and controllers.

In some examples described herein, a single memory array may contain mostly ferroelectric capacitors with some paraelectric capacitors or linear capacitors. As described herein, examples that describe or dicuss paraelectric materials or paraelectric capacitors may additionally or alternatively employ linear materials or linear capacitors may also be. For example, the paraelectric capacitors may act as a DRAM cache to the FeRAM array. FeRAM cells may have an endurance limit such that they may no longer store differentiable logic values due to degradation induced by reading or writing the ferroelectric material. The DRAM cache may help prevent FeRAM cells from reaching their endurance limit because the paraelectric capacitor of a DRAM cell may have an endurance limit many orders of magnitude greater than the FeRAM cell. Read attempts to a FeRAM cell may be cached in a DRAM cell and any future read attempts of the same FeRAM cell may be directed to the DRAM cell, eliminating the need to access the FeRAM cell. Additionally or alternatively, repeated access attempts of a FeRAM cell may be detected, and the data may be transferred to a DRAM cell and future access attempts may be directed to the DRAM cell. The DRAM cache may take the form of a single row of the memory device, a row per memory bank, or various row/column combinations.

In some examples described herein, separate memory arrays, DRAM and FeRAM, may be formed on a single die, and the DRAM array may act as a cache for the non-volatile FeRAM array. Thus, the DRAM array may act as a quickly accessible memory and the FeRAM array may act as long-term storage. Larger amounts of data, such as pages, may be swapped between the two arrays. In some cases, this transfer may be managed internally (i.e., on the die) and thus may have reduced latency compared to moving data between separate memory arrays on separate dies.

In some examples described herein, an FeRAM array may act as a back-up to the DRAM array in the event of a power interruption by transferring data from the DRAM to the FeRAM. Separate DRAM and FeRAM arrays may be formed on the same die. Some or all of the DRAM data may be transferred to the FeRAM array. Because both arrays are on the same die, this transfer may be faster and consume less power than if the data were transferred to a separate die. This may reduce or eliminate the need for additional components to provide power during the transfer.

Features of the disclosure introduced above are further described below in the context of a memory array. Specific examples are then described for various embodiments that include volatile and non-volatile memory cells on a single die. These and other features of the disclosure are further illustrated by and described with reference to apparatus diagrams, system diagrams, and flowcharts that relate to a hybrid memory device.

FIG. 1 illustrates an example memory array 100 that supports a hybrid memory device in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may include a capacitor to store a charge representative of the programmable states; for example, a charged and uncharged capacitor may represent two logic states, respectively. Memory cells 105 may be a capacitor with a dielectric material. Dielectric materials exhibit a non-zero electric polarization when exposed to an external electric field, for example, an electric field created by charged plates of a capacitor. Dielectric material may include materials with linear properties (e.g., a current and voltage relationship of a dielectric material may be linear) and may be referred to as paraelectric in examples. Dielectric and paraelectric materials may be distinct from ferroelectric materials. In other cases, memory cell 105 may be a ferroelectric memory cell that may include a capacitor with a ferroelectric material. Ferroelectric materials have a spontaneous electric polarization, that is, they have a non-zero polarization in the absence of an electric field. Different levels of charge of a ferroelectric capacitor may represent different logic states. Additional details of paraelectric and ferroelectric memory cells 105 are discussed below.

Operations such as reading and writing memory cells 105 may be performed by activating or selecting the appropriate access line 110 or bit line 115. Access lines may also be referred to as word lines 110, and bit lines 115 may also be referred to as digit lines 115. References to word lines and bit lines, or their analogues, are interchangeable without loss of understanding or operation. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, a conductive metal compound, conductively-doped semiconductors, or other conductive materials. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. In other examples, word line 110 may be a buried word line, which is discussed below in further detail. In other architectures, memory cell 105 may be located between a crossing of a word line 110 and a bit line 115, which may be called a cross-point architecture. A pillar structure may exist at the crossing and separate the word line 110 and bit line 115. In such cases, the selection component may be integrated with the memory cell 105, that is, the word line 110 may not directly control the operation of the selection component. This is discussed below in further detail.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed. In some cases, array 100 may include both FeRAM and DRAM cells, and data may be transferred between the cells.

Upon accessing, a memory cell 105 may be read, or sensed, by sense component 125 to determine the stored state of the memory cell 105. For example, after accessing the memory cell 105, the capacitor of memory cell 105 may discharge onto its corresponding digit line 115. In the case of a ferroelectric capacitor, discharging may be based on biasing, or applying a voltage, to the ferroelectric capacitor, whereas in the case of a DRAM cell, the capacitor may discharge onto its digit line 115 upon accessing the cell and without applying a voltage to the capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135.

A memory cell 105 may be set, or written, by activating the relevant word line 110 and digit line 115—i.e., a logic value may be stored in the memory cell 105. Column decoder 130 may accept data, for example input 135, to be written to the memory cells 105. Writing a DRAM memory cell 105 or a FeRAM cell 105 is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. Memory cells 105 with ferroelectric capacitors may have beneficial properties, for example, non-volatility, that may result in improved performance relative to other memory architectures. As explained herein, by combining DRAM and FeRAM memory cells on a single die, a memory device may have positive attributes of both memory types.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. One, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state. Memory controller 140 may also receive external indications (e.g., from a user or software) to transfer data between a FeRAM cell 105 and a DRAM cell 105.

Figure 2:
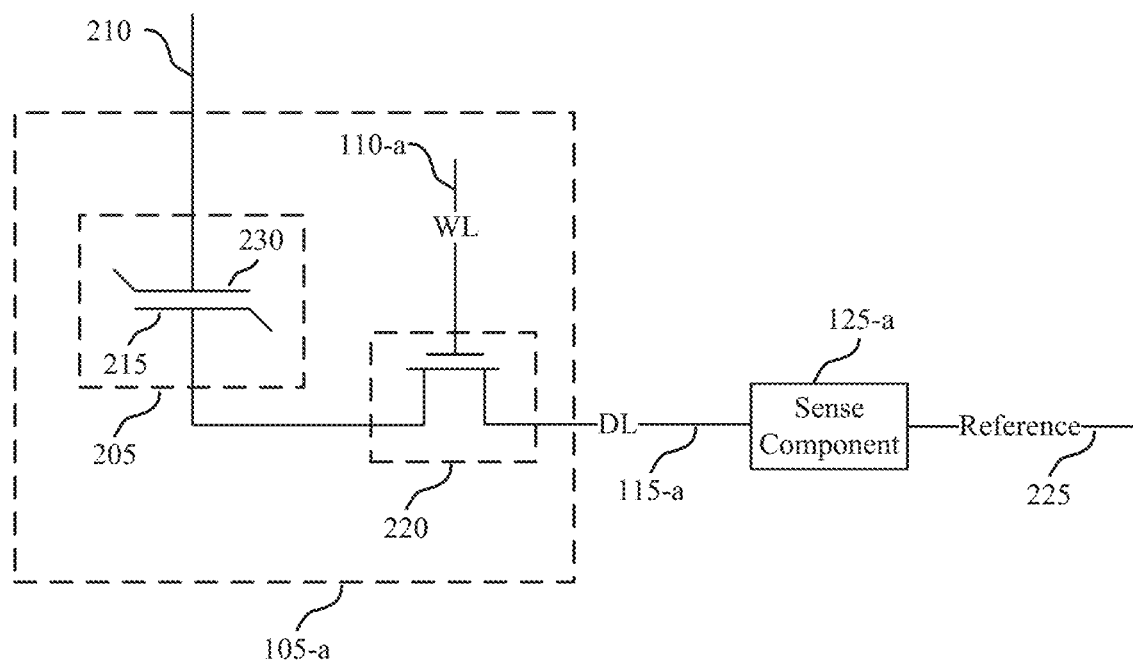
FIG. 2 illustrates an example circuit of a memory cell supported by a hybrid memory device in accordance with various embodiments of the present disclosure.

FIG. 2 illustrates an example circuit 200 that includes a memory cell 105 and supports a hybrid memory device in accordance with various embodiments of the present disclosure. Circuit 200 may represent one type of memory cell architecture. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material or a paraelectric material positioned between them. The orientation of cell plate 230 and cell bottom 215 may be flipped without changing the operation of memory cell 105-a. Circuit 200 also includes selection component 220 and reference signal 225. In the example of FIG. 2, cell plate 230 may be accessed via plate line 210 and cell bottom 215 may be accessed via digit line 115-a. In other cases, plate line 210 may not be present. For example, DRAM memory cells with a paraelectric material may be operated with digit line 115-a alone. As described above, various states may be stored by charging or discharging capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting or accessing memory cell 105-a. In some cases, selection component 220 is a transistor and its operation is controlled by applying a voltage to the transistor gate using word line 110-a, where the voltage magnitude is greater than the threshold magnitude of the transistor. In some examples, the positions of selection component 220 and capacitor 205 may be switched, such that selection component 220 is connected between plate line 210 and cell plate 230 and such that capacitor 205 is between digit line 115-a and the other terminal of selection component 220. In these examples, selection component 220 may remain in electronic communication with digit line 115-a through capacitor 205. This configuration may be associated with alternative timing and biasing for read and write operations.

If memory cell 105-a has a ferroelectric material between the plates of capacitor 205, and as discussed in more detail below, capacitor 205 may not discharge upon connection to digit line 115-a. To sense the logic state stored by ferroelectric capacitor 205, word line 110-a may be biased to select memory cell 105-a and a voltage may be applied to plate line 210. This bias may be applied after activating selection component 220, or the bias may be constantly applied to cell plate 230. Biasing plate line 210 may result in a voltage difference across capacitor 205, which may yield a change in the stored charge on capacitor 205. The magnitude of the change in stored charge may depend on the initial state of capacitor 205—e.g., whether the initial state stored a logic 1 or a logic 0. This may induce a change in the voltage of digit line 115-a based on the charge stored on capacitor 205, which may be used to determine the stored logic state In the case where memory cell 105-a has a linear or paraelectric material between the plates of capacitor 205, capacitor 205 may discharge onto digit line 115-a after selection component 220 is activated. That is, a plate line 210 may not be present and memory cell 105-a may be sensed without applying an external bias to capacitor 230 in some examples.

The change in the voltage of digit line 115-a may depend on its intrinsic capacitance—e.g., as digit line 115-a is energized, some finite charge may be stored in digit line 115-a and the resulting voltage of the digit line may depend on the intrinsic capacitance of digit line 115-a. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a.

Sense component 125-a may include various transistors or amplifiers to detect and amplify a difference in signals, which may be referred to as latching. Sense component 125-a may include a sense amplifier that receives and compares the voltage of digit line 115-a and reference signal 225, which may be a reference voltage. Sense component 125-a may then latch the output of the sense amplifier or the voltage of digit line 115-a, or both. The latched logic state of memory cell 105-a may then be output, for example, through column decoder 130 as output 135 with reference to FIG. 1.

To write memory cell 105-a, a voltage may be applied across capacitor 205. Various methods may be used. In some examples, selection component 220 may be activated through word line 110-a in order to electrically connect capacitor 205 to digit line 115-a. For a ferroelectric capacitor 205, a voltage may be applied across capacitor 205 by controlling the voltage of cell plate 230 (through plate line 210) and cell bottom 215 (through digit line 115-a) to apply a positive or negative voltage across the capacitor 205. For a linear or paraelectric capacitor 205, cell plate 230 may be virtually grounded and capacitor 205 may be charged by applying a voltage to cell bottom 215 using digit line 115-a.

FIG. 3 illustrates example electrical properties, using plots 300, of various materials for memory cells that support a hybrid memory device in accordance with various embodiments of the present disclosure. Plot 300-a illustrates an example hysteresis curve for a ferroelectric material and plot 300-b illustrates an example polarization of a linear material 335 and a paraelectric material 340. Plots 300 depict the charge, Q, stored on a capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. In contrast, a linear or paraelectric material exhibits polarization only in the presence of an external electric field. Electric polarization within a ferroelectric capacitor results in a net charge at the ferroelectric material's surface that attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, paraelectric capacitors employed in DRAM arrays. This may reduce the need to perform refresh operations compared to some DRAM architectures as described above.

As depicted in plot 300-a, the ferroelectric material may maintain a positive or negative charge with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage. Charge states 305 and 310 may also be referred to as the remnant polarization (Pr) values, i.e., the remaining polarization (and thus the charge) upon removing the external bias (e.g., voltage). The coercive voltage is the voltage at which the charge (or polarization) is zero.

The ferroelectric material of the memory cells 105 discussed herein may be a compound that includes hafnium, zirconium, or oxygen, or any combination thereof. For example, it may be include hafnium oxide or zirconia. Such a ferroelectric material may be beneficial for reducing the dimensions of a memory cell 105. For example, some ferroelectric materials may lose their ferroelectric properties as their dimensions shrink. In some cases, ferroelectric materials with at least one dimension less than 100 nm may not exhibit ferroelectric properties. Ferroelectric materials that include hafnium oxide or zirconia, however, may continue to exhibit their ferroelectric properties in components with small dimensions, for example, a thin film with a thickness less than 100 nm.

Plot 300-b illustrates example polarization curves for a linear material 335 and a paraelectric material 340. As shown, the charge, Q, of linear material 335 is linear with the applied voltage, V. Paraelectric material 340 exhibits a non-linear charge with voltage. As compared with a ferroelectric material shown in polarization curve 300-a, however, both linear material 335 and paraelectric material 340 have a zero charge at zero voltage. Different logic states may be stored by applying a non-zero voltage to a capacitor with linear material 335 or paraelectric material 340. For example, charge state 305-b and 305-c may represent a logic 0 for linear material 335 and paraelectric material 340, respectively. Negative voltages may be used as well. A charge of zero (charge state 310-b) may represent a logic 1 for linear material 335 and paraelectric material 340. Because the capacitor has a non-zero voltage when charged, it may be energetically favorable for electrons to leak away from the capacitor. Thus, the stored charge may leak until it reaches zero charge—that is, a logic 0 becomes a logic 1—and the stored logic state becomes corrupted or lost. Accordingly, linear material 335 and paraelectric material 340 may be termed "volatile memory."

Figure 4:
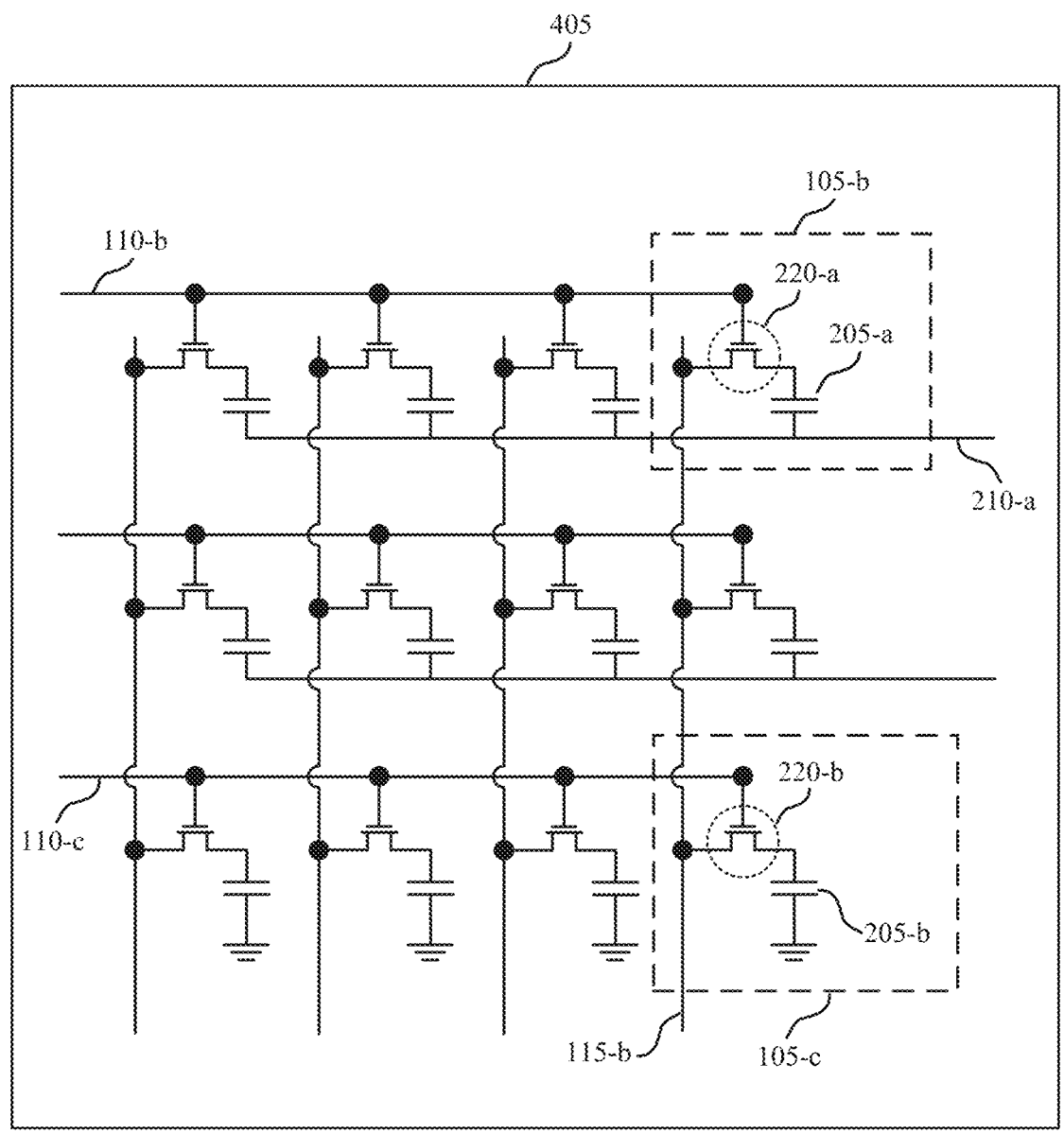
FIG. 4 illustrates an example memory array that supports a hybrid memory device in accordance with various embodiments of the present disclosure.

FIG. 4 illustrates an example memory array 100-a that supports a hybrid memory device in accordance with various embodiments of the present disclosure. Memory array 100-a may be an example of memory array 100 described with reference to FIG. 1. Memory array 100-a includes memory cells 105-b and 105-c, word lines 110-b and 110-c, and bit line 115-b, which may be examples of a memory cell 105, word line 110, and bit line 115, as described with reference to FIGS. 1 and 2. Memory array 100-a also includes plate line 210-a that is commonly connected to multiple memory cells 105 with a ferroelectric capacitor. Plate line 210-a may be an example of plate line 210 with reference to FIG. 2. Memory array 100-a also includes selection components 220-a and 220-b, which may be an example of selection component 220 with reference to FIG. 2. Memory array 100-a, including memory cells 105-b and 105-c, may be formed on substrate 405, which may be a single die. Memory cells 105-c may act as a cache for memory cells 105-b to prevent memory cells 105-b from reaching their endurance limit, for example.

Memory cell 105-b may have a ferroelectric capacitor and thus may be referred to as a FeRAM cell 105. In some cases, the ferroelectric material may be a compound of hafnium or zirconium or oxygen, or any combination thereof; for example, it may be composed of hafnium oxide or zirconia, as discussed with reference to FIG. 3. Memory cell 105-c may have a paraelectric capacitor and may be referred to as a DRAM cell 105. Memory cell 105-c may have one terminal of its capacitor grounded or virtually grounded.

FeRAM may have a limited endurance compared to DRAM, that is, FeRAM cell 105-b may have a limited number of read or write cycles that it can support over its lifetime, whereas DRAM cell 105-c may have an unlimited or effectively unlimited endurance. For example, reading and writing FeRAM cell 105-b may slowly degrade its ferroelectric capacitor, whereas reading and writing DRAM cell 105-b may not degrade its paraelectric capacitor. In some cases, the endurance of a FeRAM array may be insufficient for some deployments or uses where a small fraction of the memory cells are subjected to their endurance limit. For example, FeRAM cell 105-b may have an endurance limit appropriate for many typical electronic applications; however, a malicious attack (e.g., due to a computer virus or unauthorized access) may attempt to destroy the memory by continuously reading or writing memory cells 105 until they reach their endurance limit. Thus, a DRAM cache may be incorporated with the FeRAM cells 105-b in memory array 100-a in order to accommodate these situations and thus make FeRAM more widely deployable.

An example host device of memory array 100-a may be a mobile device or smartphone. Memory array 100-a may be used instead of a typical DRAM array in the mobile device.

Memory array 100-a, which may have a density, bandwidth, and endurance comparable to a DRAM array but with near-zero standby power due to the lack of refresh operation, which may increase the battery life and allow for instant-on operation following a standby or un-powered (e.g., "off") state. Additionally, the DRAM cache of memory array 100-a may increase the endurance of the FeRAM cells 105-b and prevent destruction due to malicious attacks.

Memory array 100-a may contain both ferroelectric memory cells 105-b and paraelectric memory cells 105-c in various proportions. For example, memory array 100-a may contain one, two, three, or more rows or columns or both of paraelectric memory cells 105-c, and the remainder of the array may be ferroelectric memory cells 105-b. Thus, substrate 405 may include memory cell 105-b that comprises a first type of capacitor and a second memory cell 105-c that comprises a second type of capacitor that is different from the first type of capacitor. In some examples, both types of capacitors may be recesses. A "recess," as the term is used herein, may refer to a property, portion, or aspect of a substrate. So substrate 405 may include a first memory cell formed in a first recess comprising a first type of capacitor and a second memory cell formed in a second recess comprising a second type of capacitor that is different from the first type of capacitor. Memory cells 105-b and 105-c may be in electronic communication with one another and/or with memory control 140, for example, such that data may be transferred between the memory cells 105.

In some cases, memory cell 105-b may be a non-volatile memory cell and memory cell 105-c may be a volatile memory cell. For example, memory cell 105-b may include a ferroelectric material and memory cell 105-c may include a paraelectric material.

Although DRAM cell 105-c is depicted in FIG. 4 as commonly connected to the same digit line 115-b as FeRAM cell 105-b, this may not be the case in every instance. For example, DRAM cell 105-c may be connected to a digit line 115 that is separate from any FeRAM cell 105, which may accommodate various sensing schemes used for FeRAM cells 105 and DRAM cells 105.

To prevent a ferroelectric memory cell from reaching its endurance limit, data stored in a FeRAM cell 105-b may be cached in DRAM cell 105-c. For example, a malicious attack may attempt to destroy FeRAM cell 105-b by performing a read operation continuously until the cell reaches its endurance limit. Caching the data stored in FeRAM cell 105-b may prevent its destruction. For example, memory array 100-a may receive a read request for memory cell 105-b, which may have a ferroelectric capacitor, and may transfer the data stored in memory cell 105-b to a second memory cell comprising a paraelectric capacitor (e.g., memory cell 105-c), where the data is transferred from memory cell 105-b to memory cell 105-c based on receiving the read request of memory cell 105-b. Memory cell 105-c may be in electronic communication with memory cell 105-b via a direct connection or a circuit path that includes other components or devices. Memory cells 105 may each be in electronic communication with memory controller 140. Transferring the data may include reading the logic value stored in memory cell 105-b and writing the logic value to memory cell 105-c.

Memory array 100-a may then direct a read attempt of memory cell 105-b to memory cell 105-c based on transferring the data from memory cell 105-b to memory cell 105-c. In other words, subsequent read operations of FeRAM cell 105-b may be serviced from the DRAM cell 105-c without further accessing FeRAM cell 105-b. As a result, future accesses of memory cell 105-*b* would not count against its cycle lifetime. In some examples, other cache methods may be used to ensure coherency with FeRAM cell 105-*b*, however, these methods may be improved due to both FeRAM cell 105-*b* and DRAM 105-*c* cell being co-located on the same substrate 405.

In operating memory array 100-*a*, multiple memory cells 105 may be accessed at the same time. For example, memory array 100-*a* may include multiple rows of memory cells, where each row includes a common access line (e.g., word line 110-*b* or 110-*c*) and an entire row of memory cells 105 may be read or written during a single access operation by activating the common access line. As such, multiple FeRAM cells 105 may be cached. That is, an entire row of memory cells 105-*b*, (e.g., the cells connected to word line 110-*b*) may be accessed simultaneously. Their logic values may be cached in DRAM cells 105-*c* (e.g., the cells connected to word line 110-*c*). For example, at least one row may have memory cells 105 that may comprise paraelectric capacitors (e.g., memory cells 105-*c* connected to word line 110-*c*) and a remainder of rows may comprise memory cells with ferroelectric capacitors (e.g., memory cells 105-*b* connected to word line 110-*b*). Memory array 100-*a* may include multiple columns as well, where each column may have a common digit line, such as digit line 115-*b*. In some examples, at least one row and at least one column may include memory cells that comprise paraelectric capacitors (e.g., memory cells 105-*c*) and a remainder of rows or a remainder of columns, or both, of the memory array 100-*a* may comprise memory cells with ferroelectric capacitors. Other row and column combinations are possible.

In some cases, memory array 100-*a* may contain buried word lines. For example, word lines 110-*b* and 110-*c* may be positioned below the capacitors 205 of memory cells 105. A buried word line 110 may be positioned between and in electronic communication with the capacitors of two memory cells 105. The two memory cells 105 may be in electronic communication with a digit line 115 through a common contact. Thus, the buried word line 110 may not be coupled to a digit line 115, which may reduce the total capacitance and, thus, the total power to operate a memory cell 105.

In some examples, a malicious attack may circumvent a single row of DRAM cache by alternating among different cells or different rows. That is, by accessing a second row of FeRAM cells 105-*b*, those cells would be cached by overwriting the first row of FeRAM cell 105-*b* cached previously. The DRAM cache, however, could be increased in size to increase the time needed to destroy the FeRAM cells 105-*b*. For example, array 100-*a* may contain more than one row of DRAM cells 105-*c* such that more than one row of FeRAM cells 105-*b* may be cached. So, if a second set of FeRAM cells 105-*b* are read, their data may be stored in the second set of DRAM cells 105-*c*. Read attempts to either set of FeRAM cells 105-*b* may then be directed to the appropriate DRAM cells 105-*c*. This may reduce in half the time to destroy a memory cell 105. In general, more than two DRAM rows 105-*c* may be used as a cache for the FeRAM cells 105-*b*, further decreasing the time to destroy a memory cell 105.

Thus, the size of the cache may be determined based on the target access patterns for which protection from repeated accesses is sought, as well as the endurance limit for the FeRAM cells 105-*b*. For example, a first case may include a single row of DRAM cells 105 for the entire device, which may protect against the extreme case of accessing the same row continually for the life of the product. Other cases may include a row per memory bank, or various row or column combinations. In general, the proportion of DRAM cells 105-*c* to FeRAM cells 105-*b* may be relatively small since access attempts may be spread across a large number of rows, reducing the risk of exceeding the endurance limit for a single FeRAM cell 105-*b*.

Other methods may be used to trigger caching. For example, instead of caching each read operation, the memory cells may be cached after some threshold of access attempts (read or write) is met or exceeded. That is, memory array 100-*a* or a controller for memory array 100-*a* may determine that a number of access operations of memory cell 105-*b*, which may comprise a ferroelectric capacitor, meets or exceeds a threshold. Memory array 100-*a* may then transfer data from memory cell 105-*b* to a second memory cell that i comprises a paraelectric capacitor (e.g., memory cell 105-*c*), where the data is transferred from memory cell 105-*b* to memory cell 105-*c* based on the determination that memory cell 105-*b* has been accessed the threshold number of times. The memory cells 105 may be in electronic communication with one another or with memory controller 140, or both. Memory array 100-*a* may then direct an access attempt of memory cell 105-*b* to memory cell 105-*c* based on transferring the data from memory cell 105-*b* to memory cell 105-*c*. This may offer improved performance compared to caching every read operation since the caching step is performed less frequently.

A counter or portion of a controller may count each access attempt of memory cell 105-*b*, and memory array 100-*a* may determine the number of access operations meets or exceeds the threshold. In some cases, the threshold may be zero such that each access attempt is cached as discussed above. Other, positive threshold values are possible. In other cases, a timer may determine the time period between access operations, and memory array 100-*a* may determine that the time period between access operations is less than a threshold time period. Or memory array 100-*a* may determine that a rate of access operations meets or exceeds a threshold rate. For example, a counter and timer may both be used to determine a rate of access attempts. The threshold values may be predetermined by the manufacturer or programmed by the user. Other ways of detecting repeated access attempts may be used. Further, the counter may be incremented or the timer may be operated based on an access attempt of any memory cell 105 within a row of memory cells 105 or to a bank of memory cells 105.

DRAM cells 105-*c* may also be used to protect FeRAM cells 105-*b* during a write process as well. For example, if a logic value is to be written to FeRAM cell 105-*b*, the data may be written to a DRAM cell 105-*c* as well as to the FeRAM cell 105-*b*. If the same FeRAM cell 105-*b* is to be written again, the request may be directed to the DRAM cell 105-*c* without writing to the FeRAM cell 105-*b*. Further, any of the above methods may be implemented, for example, a counter or timer, to determine when to implement such a caching step.

The memory cells 105 in memory array 100-*a* may be of multiple forms. In some cases, memory cells 105-*b* and 105-*c* may be recesses, such as those illustrated in FIG. 7 below—memory cells 105-*b* and 105-*c* may thus be cells of an array or recesses. For example, recesses may be formed in substrate 405 and capacitors may be created in each recess. In some cases, a dielectric material may be formed on substrate 405 in which the recesses are formed. As noted above, the ferroelectric material may have ferroelectric properties even for dimensions less than 100 nm. Thus, the recesses used to form the memory cells 105-*b* and 105-*c* may have an opening less than 100 nm. Memory array 100-*a* may thus have a high density of ferroelectric memory cells, and existing formation processes used for DRAM arrays may be used to form both ferroelectric memory cells 105-*b* and DRAM cells 105-*c* on the same substrate 405.

In another example, memory array 100-*a* may partially or wholly be of a cross-point architecture, for example, the array architecture shown in FIG. 5 below. For example, the FeRAM cells 105-*b* may use such an architecture and their ferroelectric capacitor may still have a dimension less than 100 nm. The DRAM cells 105-*c* may have the recess architecture.

In some cases, the two memory types may be separate arrays. In other words, a first memory array comprises a first memory cell, where each memory cell of the first array comprises a first type of capacitor, and a second memory array comprises a second memory cell, where each memory cell of the second array comprises the second type of capacitor. In some cases, the first memory cell may be a non-volatile memory cell and the second memory cell may be a volatile memory cell. For example, memory cell 105-*b* may include a ferroelectric material and memory cell 105-*c* may include a paraelectric material.

In other examples, memory cells of the first type may be directly paired with a memory cell of a second type such that one cell acts as a backup of the other. For example, memory array 100-*a* may include a first memory cell type comprising a first type of capacitor (e.g., memory cell 105-*b*), and a second memory cell type comprising a second type of capacitor that is different from the first type of capacitor (e.g., memory cell 105-*c*), where at least a subset of memory array 100-*a* comprises a plurality of memory cell pairs, where each memory cell pair comprises a first memory cell of the first memory cell type and a second memory cell of the second memory cell type. FeRAM cell 105-*b* may, for example, act as a back-up for its paired DRAM cell 105-*c*. In some cases, memory array 100-*a* may include multiple rows and columns, and the second memory cell of the memory cell pair is located in a column or row adjacent to the first memory cell. The first type of capacitor may comprise a ferroelectric insulator and the second type of capacitor may comprise a paraelectric material or a linear diaelectric material.

Figure 5:
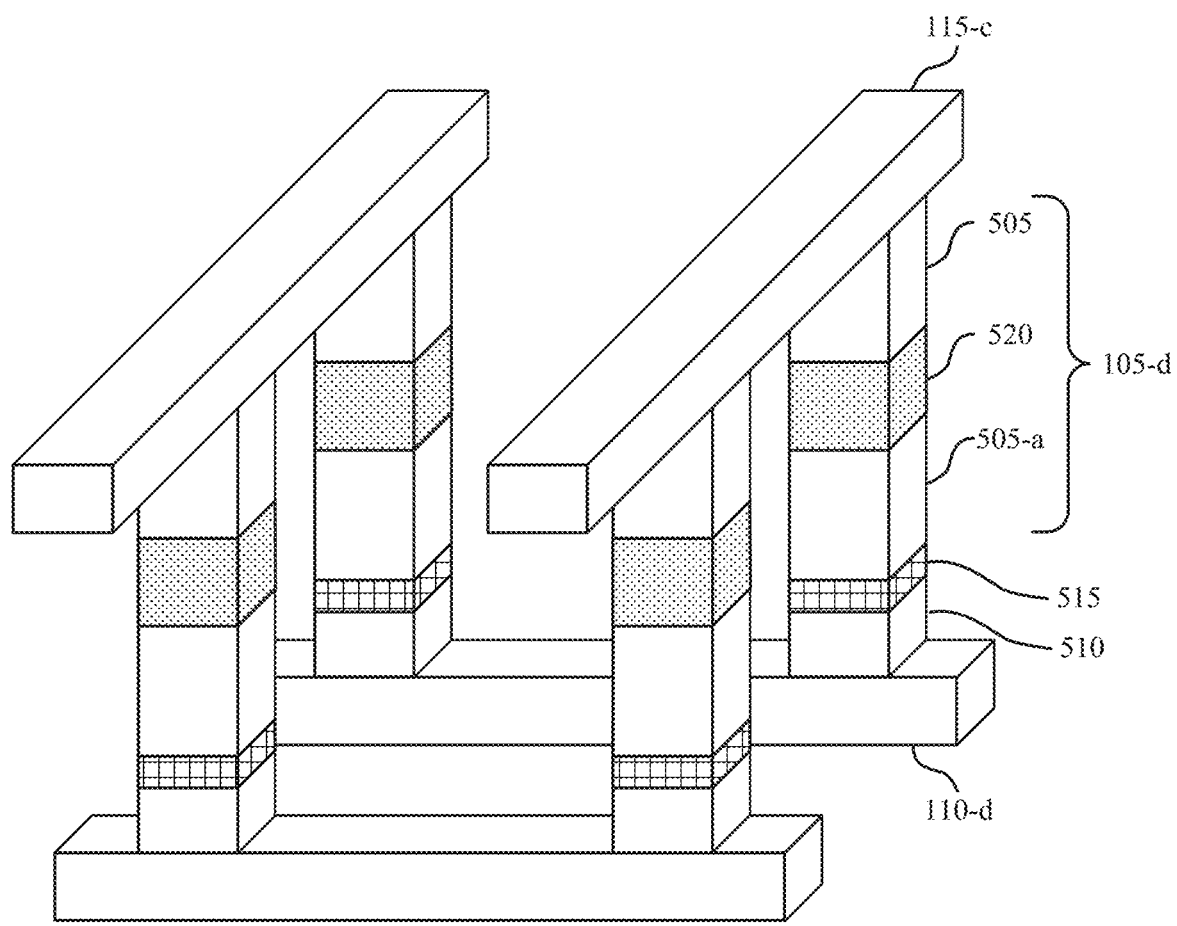
FIG. 5 illustrates an example memory array that supports a hybrid memory device in accordance with various embodiments of the present disclosure.

FIG. 5 illustrates an example memory array 100-*b* that supports a hybrid memory device in accordance with various embodiments of the present disclosure. Memory array 100-*b* may be an example of memory array 100 with reference to FIGS. 1 and 4. Memory array 100-*b* includes memory cell 105-*d*, word lines 110-*d*, and bit lines 115-*c*, which may be examples of a memory cell 105, word line 110, and bit line 115, as described with reference to FIGS. 1, 2, and 4. Memory cell 105-*d* includes electrode 505, electrode 505-*a*, and memory element 520, where memory element 520 may be a ferroelectric material. Memory array 100-*b* also includes bottom electrode 510 and selection component 515. In some cases, a 3D memory array may be formed by stacking multiple memory arrays 100-*b* on one another. In some cases, the two stacked arrays may have common access lines such that each level may share word lines 110 or bit lines 115. As described above, various logic states may be stored by programming memory element 520. Memory array 100-*b* may be combined with other memory architectures as well, for example, capacitors formed in recesses.

Memory array 100-*b* may be referred to as cross-point architecture, where a pillar is situated at the crossing of a word line 110 and a bit line 115. For example, memory cell 105-*d* is shown as a pillar structure where word line 110-*d* and bit line 115-*c* cross. The pillar structure may include various electrodes, the selection component 515, and memory element 520, as shown. Other configurations may be possible.

Memory array 100-*b* may be made by various combinations of material formation and removal. For example, layers of material may be deposited that correspond to the word line 110-*d*, bottom electrode 510, selection component 515, electrode 505-*a*, memory element 520, and electrode 505. Material may be selectively removed to then create the desired features, such as the pillar structure depicted in FIG. 5. For example, features may be defined using photolithography to pattern a photoresist and then material may be removed by techniques such as etching. Bit lines 115-*c* may then be formed, for example, by depositing a layer of material and selectively etching to form the line structure depicted in FIG. 5. In some cases, electrically insulating regions or materials may be formed or deposited. The electrically insulating regions may include oxide or nitride materials, such as silicon oxide, silicon nitride, or other electrically insulating materials.

Selection component 515 may, in some cases, be connected in series between a memory cell 105-*d* and at least one conducive line such as a word line 110-*d* or a bit line 115-*c*. For example, as depicted in FIG. 5, selection component 515 may be located between electrode 505-*a* and bottom electrode 510; thus, selection component 515 is located in series between memory cell 105-*d* and word line 110-*d*. Other configurations are possible. For example, selection component may be located in series between memory cell 105-*d* and bit line 115-*c*. The selection component may aid in selecting a particular memory cell 105-*d* or may help prevent stray currents from flowing through non-selected memory cells 105-*d* adjacent a selected memory cell 105-*d*. The selection component may include an electrically non-linear component (e.g., a non-ohmic component) such as a metal-insulator-metal (MIM) junction, an ovonic threshold switch (OTS), or a metal-semiconductor-metal (MSM) switch, among other types of two-terminal select device such as a diode. In some cases, the selection component is a chalcogenide film.

As discussed above, memory cell 105-*d* of FIG. 5 may include a ferroelectric memory element 520, which may have non-volatile storage capabilities. As discussed above, a DRAM cell may be used as a cache for memory array 100-*b* in order to preserve the lifetime of memory array 100-*b*. Both the DRAM cache and memory array 100-*b* may be located on the same substrate or die.

Figure 6:
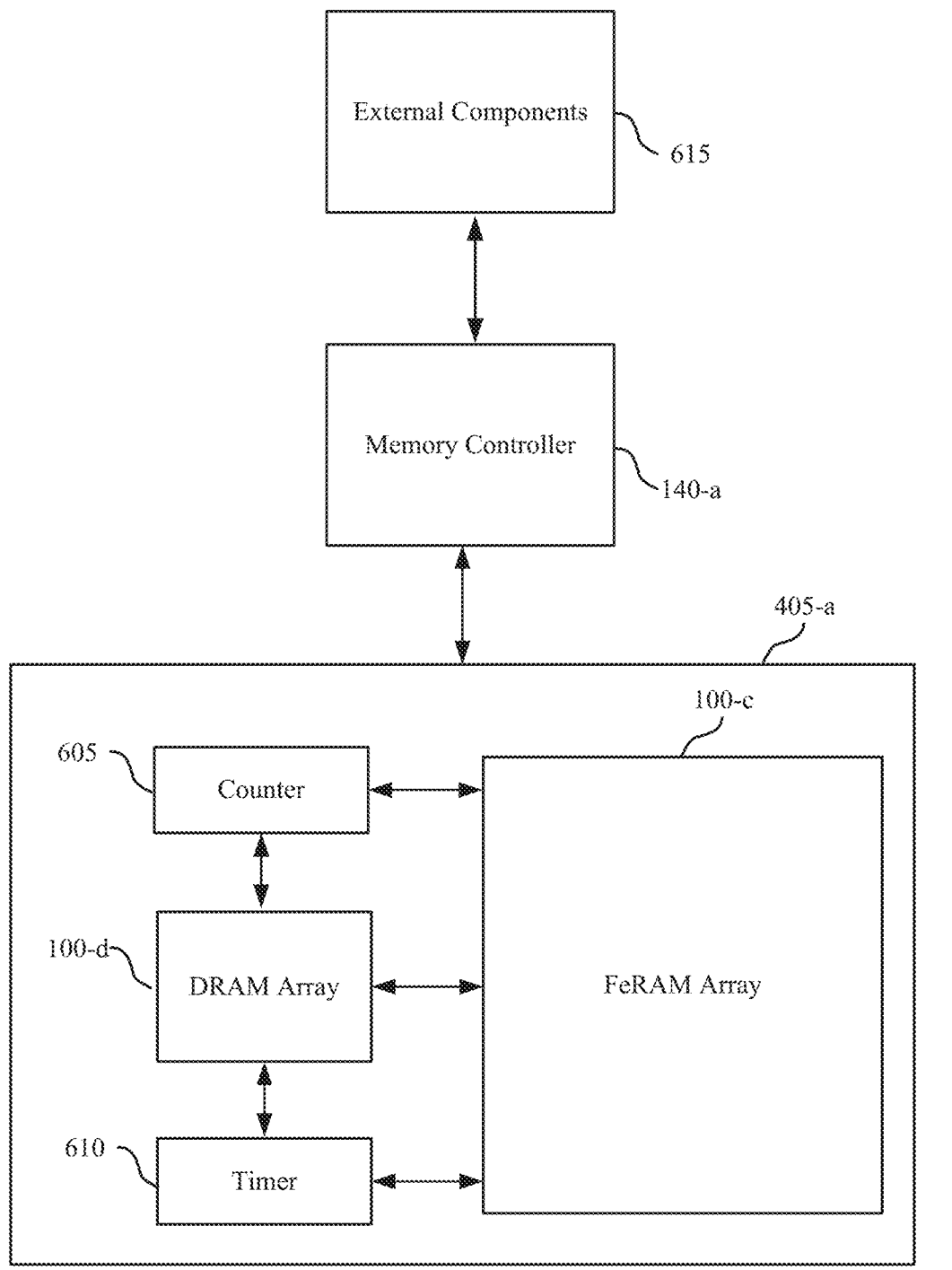
FIG. 6 illustrates a system, including a hybrid memory device, that supports a hybrid memory device in accordance with various embodiments of the present disclosure.

FIG. 6 illustrates a system, including a hybrid memory device, in accordance with various embodiments of the present disclosure. System 600 includes a substrate 405-*a*, which may be an example of a substrate 405 with reference to FIG. 4. System 600 includes memory arrays 100-*c* and 100-*d*, which may be an example of a memory array 100 with reference to FIGS. 1, 4, and 5. Memory array 100-*c* may be a non-volatile memory array and memory array 100-*d* may be a volatile memory array. System 600 also includes a counter 605, timer 610, external components 615, and a memory controller 140-*a*, which may be an example of a memory controller 140 with reference to FIG. 1.

Memory arrays 100-*c* and 100-*d* may be located on the same substrate 405-*a* (or die), which may have increased performance compared to each array located on a separate die, as discussed above. In some cases, memory arrays 100-*c* and 100-*d* may be a single, combined memory array. Memory controller 140-*a* is shown external to substrate 405-*a* in FIG. 6 but, in some cases, it may be located on substrate 405-*a*. Further, counter 605 and timer 610 may be located separately from substrate 405-*a* or may be part of memory controller 140-*a*.

Memory array 100-*c* may be a FeRAM array, that is, it may contain memory cells with a ferroelectric capacitor. As such, memory array 100-*c* may be referred to as FeRAM array 100-*c*. FeRAM array 100-*c* may be composed of memory cells 105 with a recess. In some cases, FeRAM array 100-*c* may be include memory cells 105 with a pillar structure, for example, the cross-point architecture as discussed with reference to FIGS. 4 and 5.

Memory array 100-*d* may be a DRAM array, that is, it may contain memory cells with a paraelectric capacitor. Thus, memory array 100-*d* may be referred to as DRAM array 100-*d*. DRAM array 100-*d* may be composed of memory cells 105 with a recess as discussed with reference to FIG. 4.

In some cases, FeRAM array 100-*c* may be used for storage and DRAM array 100-*d* may act as a cache for FeRAM array 100-*c*. For example, FeRAM array 100-*c* may have an improved die area efficiency compared to a DRAM array 100-*d*. For example, the FeRAM array 100-*c* may be a cross-point array (e.g., as shown in FIG. 5) where each memory cell occupies a smaller die area than a DRAM cell 105. Further, the cross-point array may be a three-dimensional array, thus significantly increasing area efficiency. In some cases, FeRAM array 100-*c* may have a higher latency or higher activation power compared to DRAM array 100-*d*, and it may be advantageous to use DRAM array 100-*d* as a cache for FeRAM array 100-*c*. For example, pages, or units of multiple memory cells 105, may be swapped between the FeRAM array 100-*c* and DRAM array 100-*d*. Because both arrays may be on the same substrate 405-*a*, this transfer may be faster than if they were on separate substrates or dies. In some examples, the DRAM array 100-*d* may be managed without intervention by an external processor or component. For example, the transfer may be managed internally as a cache but with the ability to manage larger local cache lines.

In some cases, memory controller 140-*a* may manage the memory arrays 100-*c* and 100-*d*. For example, memory controller 140-*a* may receive an indication to transfer at least one logic value between a first memory cell 105 of a first cell type and a second memory cell 105 of a second cell type, wherein the first cell type comprises a ferroelectric capacitor and the second cell type comprises a paraelectric capacitor. For example, the first memory cell 105 may be a part of FeRAM array 100-*c* and the second memory cell 105 may be part of DRAM array 100-*d*. The memory controller 140-*a* may transfer the at least one logic value between the first memory cell and the second memory cell. For example, in a write operation to FeRAM array 100-*c*, the logic value may be written first to DRAM array 100-*d*. Memory controller 140-*a* may read the stored logic value in DRAM array 100-*d* and then write it to the FeRAM array 100-*c*. For a read operation, memory controller 140-*a* may read the logic value stored in FeRAM array 100-*c* and write it to DRAM array 100-*d*, such that it is cached in DRAM array 100-*d* where it may be accessed in accordance with other operations. These operations are not limited to single memory cells 105, for example, the operations may involve multiple memory cells 105 or memory pages. For example, a quantity of memory cells of FeRAM array 100-*c* may be greater than a quantity of memory cells of DRAM array 100-*d*, and transferring the at least one logic value may include transferring a subset of logic values between the first and second memory arrays.

Such a system may be beneficial for baseline systems include computing platforms based on a DRAM main memory and either a hard disk drive (HDD) and/or NAND solid state drive (SSD) storage, for example. In some cases, the latency of FeRAM array 100-*c* may be orders of magnitude better than NAND or HDD, and the negative performance impact due to paging memory to/from storage may be greatly reduced. The combination of DRAM array 100-*d* and FeRAM array 100-*c* on the same substrate 405-*a* may further reduce the impact of those transfers on system performance (e.g., as measured with respect to time) and will also consume less power than if making those transfers between separate DRAM and NAND/HDD devices across two system interfaces and through the host memory controller and input/output (TO) hub.

In some cases, FeRAM array 100-*c* may act as a backup to DRAM array 100-*d*. For example, if the power to DRAM array 100-*d* is interrupted, data stored in DRAM array 100-*d* may be transferred to the non-volatile FeRAM array 100-*c*. In such cases, the size of DRAM array 100-*d* may be the same or smaller as FeRAM array 100-*c* in quantity of memory cells 105. Other relative sizes may be possible. Upon power interruption, the contents of DRAM array 100-*d*, or a designated portion, may be transferred to FeRAM array 100-*c*. Because the transfer is contained within a single substrate 405-*a*, the power requirements for the transfer may be reduced or eliminated (compared to arrays on different substrates or dies), which may eliminate other components, such as supercapacitors, used to transfer data to other dies during such power interruptions. In some cases, conventional non-volatile storage methods could be used to ensure that contents of the DRAM array 100-*d* at the time of a power interruption are either accepted as lost or protected in order to achieve persistent memory.

Such a system may have further benefits. For example, non-volatile dual in-line memory module (NVDIMM) with DRAM and NAND memories require a power source that is designed to provide back-up power for the amount of time it takes to transfer DRAM contents to NAND in the event of a power interruption, and must provide enough power for that duration to make those transfers between separate devices. In the example discussed above with FeRAM array 100-*c* and DRAM array 100-*d* on the same substrate 405-*a*, those transfers would be both faster and on-chip, reducing the power requirements two ways.

The indications to transfer data between memory arrays 100-*c* and 100-*d* may come from external components 615, which may represent external hardware or software. In other words, the indication to transfer the at least one logic value may include receiving the indication from a component external to the substrate 405-*a*. In some cases, the indication to transfer the at least one logic value between the first memory cell and the second memory cell may be based on the host device powering down. For example, a smartphone device may power down and the contents of the volatile DRAM array 100-*d* may be transferred to the non-volatile FeRAM array 100-*c* to preserve the data.

FIGS. 7A, 7B, and 7C illustrate an example process flow for forming a hybrid memory device, which may include processing steps 700, 701, 702, 703, 704, and 705, in accordance with various embodiments of the present disclosure. The resulting memory device may be an example of the memory cell architecture in memory arrays 100 with reference to FIGS. 1, 4, and 6. Processing steps 700-705 include formation of dielectric material 710, electrode material 715, mask material 720, ferroelectric material 725, electrode material 730, and paraelectric material 735. Processing steps 700-705 may form two types of memory cells 105 on a single substrate or die. The resulting memory cells may be capacitors formed in recesses. In some examples, the capacitors may be in electronic communication with a buried word line 110.

Various techniques may be used to form materials or components shown in FIGS. 7A-7C and FIG. 8 below. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

At processing step 700, recesses may be formed in dielectric material 710. In some cases, an array of recesses may be formed. The largest dimension of the opening of the recess may be less than 100 nm. Dielectric material 710 may be a substrate or may be dielectric material deposited on a substrate. The recesses may be formed using various etching techniques, which may use photomasks and photolithography to define the features as necessary.

At processing step 701, electrode material 715 may be deposited to form a first conductive material on the surface of two or more recesses of the array. In some cases, this may correspond to a first electrode of the capacitors. Electrode material 715 outside the recess may be removed. Mask material 720 may then be formed to cover one type of memory cell.

At processing step 702 in FIG. 7B, a first memory element material comprising ferroelectric material 725 may be formed in a first recess of the array, where the first memory element material is coupled to the electrode material 715 in the first recess. Thus, a memory element may be formed within the recess not covered by mask material 720. The ferroelectric material may be a compound that comprises hafnium or zirconium or oxygen, or any combination thereof, for example, hafnium oxide or zirconia.

A second conductive material may then be formed by depositing electrode material 730, which is coupled to the first memory element material (ferroelectric material 725) of the first recess. Electrode material 730 may be the second electrode of the capacitor. At processing step 703, mask material 720 may be removed to expose the previously masked recess.

At processing step 704 in FIG. 7C, a second mask material 720 may be formed to cover the previously formed capacitor with the ferroelectric material 725. Then, a second memory element material comprising paraelectric material 735 may be formed in a second recess of the array, where the second memory element material is coupled to the first conductive material (electrode material 715) in the second recess. A third conductive material coupled to the second memory element material of the second recess may then be formed, for example, by depositing electrode material 730.

At processing step 705, the second mask material 720 may be removed. The resulting structure is two memory cell types, a paraelectric and a ferroelectric memory cell. Although shown next to each other, the memory cell types need not be next to each other. Mask material 720 may be patterned appropriately to mask off any part of the memory array during processing. Thus, ferroelectric memory cells may be formed in one part of the memory array and paraelectric memory cells may be formed in another part.

FIG. 8 illustrates an example process 800 for forming a hybrid memory device in accordance with various embodiments of the present disclosure. The resulting memory device may be an example of the memory cell architecture in memory arrays 100 with reference to FIGS. 1, 4, 5, and 6. Process 800 includes formation of dielectric material 805, electrode material 810, electrode material 815, paraelectric material 820, ferroelectric material 825, selection component material 830, word line material 835, bit line material 840, and dielectric material 845. Process 800 may form two types of memory cells 105 on a single substrate or die. One type may be a recess, as discussed in FIG. 7, and the other may be a cross-point structure as discussed in FIG. 5.

Process 800 may include forming paraelectric memory cells in recesses as discussed with reference to FIG. 7. For example, recesses may be formed in dielectric material 805. Dielectric material 805 may be a substrate or may be dielectric material deposited on a substrate. The recesses may be formed using various etching techniques, which may use photomasks and photolithography to define the features. Electrode material 715 may be deposited to create a first electrode of the capacitors. Electrode material 715 outside the recess may be removed. Paraelectric material 820 may be deposited to form a film on electrode material 715 within the recess. Electrode material 815 may then be deposited to form the second electrode of the capacitor.

Process 800 may include forming a ferroelectric cross-point array. Multiple methods may be used to form the cross-point array. A stack of materials may be formed by depositing material on a substrate, for example, by depositing layers of material. For instance, layers corresponding to word line material 835, electrode material 810, selection component 830, electrode material 810, ferroelectric material 825, and electrode material 810 may be deposited. The stack may be etched to create channels in one direction. The etched channels may be defined with appropriate masks. The channel may be filled with dielectric 845. Bit line material 840 may then be formed on top of the resulting structure. A second etching step may then form the pillar structure. For example, by etching a second set of channels in a direction substantially perpendicular to the first set. Similarly, the second set of etched channels may be defined with appropriate masks.

Thus, process 800 may include forming a first memory array on a substrate, the first memory array comprising recessed paraelectric capacitors and forming a second memory array on the substrate, the second memory array comprising a plurality of pillars, where each of the plurality of pillars comprise a ferroelectric capacitor.

Figure 9:
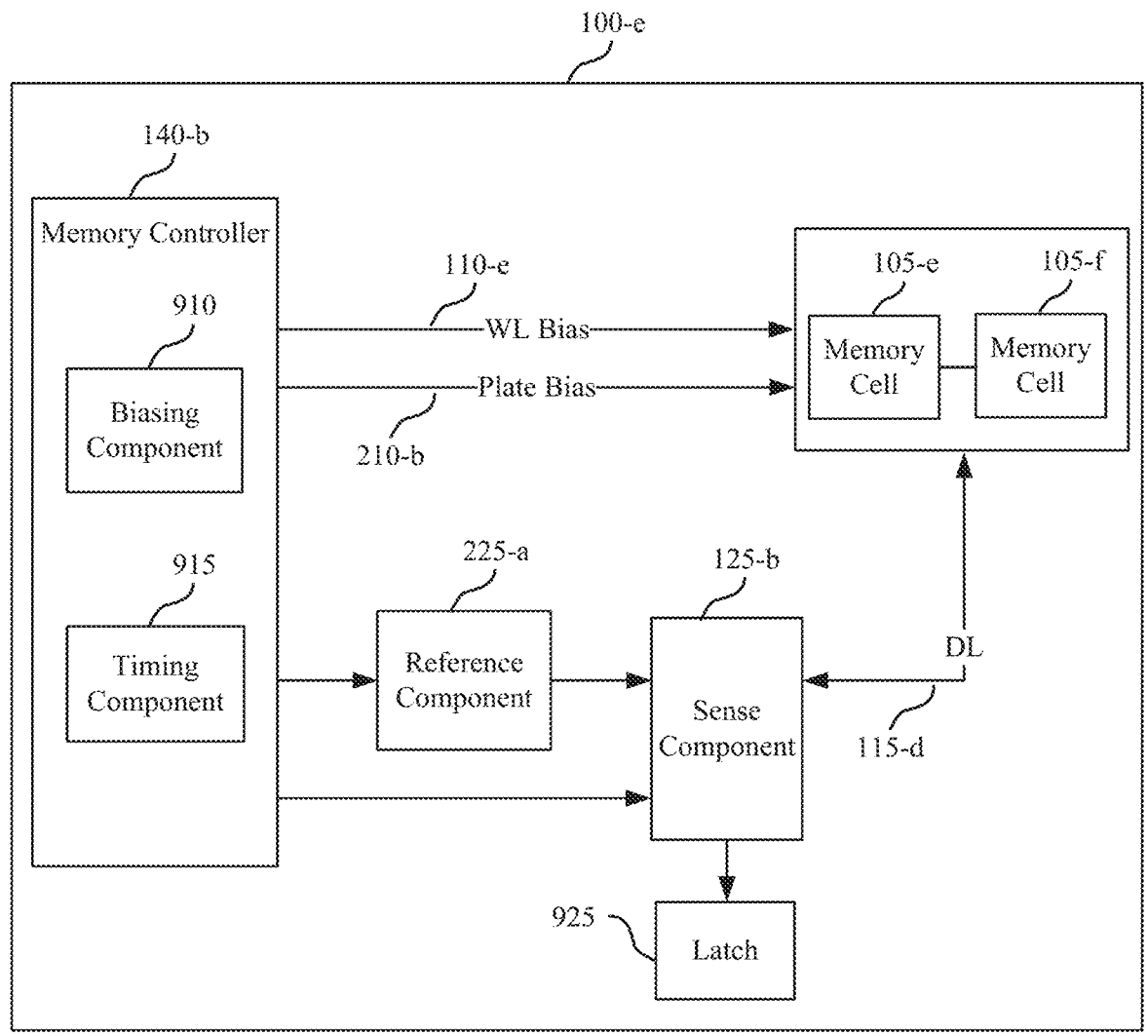
FIG. 9 illustrates a block diagram of an example hybrid memory device in accordance with various embodiments of the present disclosure.

FIG. 9 shows a block diagram 900 of a memory array 100-*e* that supports a hybrid memory device in accordance with various embodiments of the present disclosure. Memory array 100-*e* may be referred to as an electronic memory apparatus and includes memory controller 140-*b* and memory cells 105-*e* and 105-*f*, which may be examples of memory controller 140 and memory cell 105 described with reference to FIGS. 1-6. Memory controller 140-*b* may include biasing component 910 and timing component 915 and may operate memory array 100-*e* as described in FIGS. 1-6. Memory controller 140-*b* may be in electronic communication with word line 110-*e*, digit line 115-*d*, sense component 125-*b*, and plate line 210-*b*, which may be examples of word line 110, digit line 115, sense component 125, and plate line 210 described with reference to FIG. 1, 2, 4, or 5. Memory array 100-*e* may also include reference component 920 and latch 925. The components of memory array 100-*e* may be in electronic communication with each other and may perform the functions described with reference to FIGS. 1-6. In some cases, reference component 920, sense component 125-b and latch 925 may be components of memory controller 140-b. Memory cell 105-e may be a non-volatile memory cell, for example a FeRAM cell, and memory cell 105-f may be a volatile memory cell, for example, a DRAM cell. Memory cells 105-e and 105-f may be in electronic communication with each other.

Memory controller 140-b may be configured to activate word line 110-e, plate 210-b, or digit line 115-d by applying voltages to those various nodes. For example, biasing component 910 may be configured to apply a voltage to operate memory cell 105-e or 105-f to read or write memory cell 105-e or 105-f as described above. In some cases, memory controller 140-b may include a row decoder, column decoder, or both, as described with reference to FIG. 1. This may enable memory controller 140-b to access one or more memory cells 105. Biasing component 910 may also provide voltage potentials to reference component 920 in order to generate a reference signal for sense component 125-b. Additionally, biasing component 910 may provide voltage potentials for the operation of sense component 125-b.

In some cases, memory controller 140-b may perform its operations using timing component 915. For example, timing component 915 may control the timing of the various word line selections or plate biasing, including timing for switching and voltage application to perform the memory functions, such as reading and writing, discussed herein. In some cases, timing component 915 may control the operations of biasing component 910.

Reference component 920 may include various components to generate a reference signal for sense component 125-b. Reference component 920 may include circuitry configured to produce a reference signal. In some cases, reference component 920 may be other ferroelectric memory cells 105. In some examples, reference component 920 may be configured to output a voltage with a value between the two sense voltages, as described with reference to FIG. 3. Or reference component 920 may be designed to output a virtual ground voltage (i.e., approximately 0V).

Sense component 125-b may compare a signal from memory cell 105-e or 105-f (through digit line 115-d) with a reference signal from reference component 920. Upon determining the logic state, the sense component may then store the output in latch 925, where it may be used in accordance with the operations of an electronic device that memory array 100-e is a part.

In some cases, memory controller 140-e may receive an indication to transfer at least one logic value between memory cell 105-e memory cell 105-f. For example, in a write operation to memory cell 105-f, the logic value may be written first to memory cell 105-e. Memory controller 140-b may read the stored logic value in memory cell 105-e and then write it to memory cell 105-f. For a read operation, memory controller 140-b may read the logic value stored memory cell 105-f and write it to memory cell 105-e, such that it is cached in memory cell 105-e where it may be accessed in accordance with other operations. These operations are not limited to single memory cells 105, for example, the operations may involve multiple memory cells 105 or memory pages.

Figure 10:
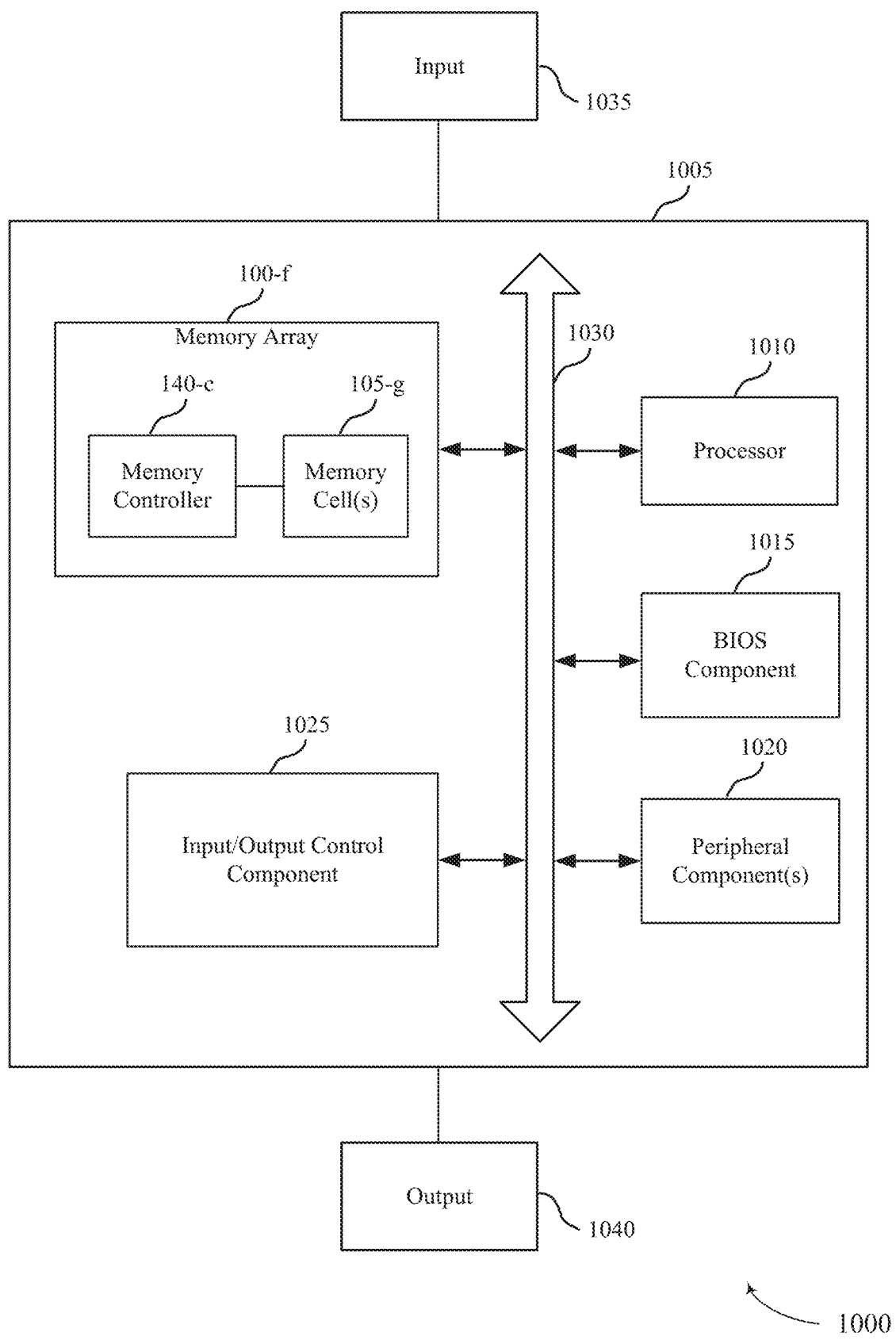
FIG. 10 illustrates a system, including a hybrid memory device, that supports a hybrid memory device in accordance with various embodiments of the present disclosure.

FIG. 10 illustrates a system 1000 that supports a hybrid memory device in accordance with various embodiments of the present disclosure. System 1000 includes a device 1005, which may be or include a printed circuit board to connect or physically support various components. Device 1005 includes a memory array 100-f, which may be an example of memory array 100 described with reference to FIGS. 1, 4, 5, 6, and 9. Memory array 100-f may contain memory controller 140-c and memory cell(s) 105-g, which may be examples of memory controller 140 described with reference to FIGS. 1, 6, and 9 and memory cells 105 described with reference to FIGS. 1, 2, 4, 5, 6, and 9. Device 1005 may also include a processor 1010, BIOS component 1015, peripheral component(s) 1020, and input/output control component 1025. The components of device 1005 may be in electronic communication with one another through bus 1030. Memory array 100-f may include both volatile and non-volatile memory cells 105.

Processor 1010 may be configured to operate memory array 100-f through memory controller 140-c. In some cases, processor 1010 may perform the functions of memory controller 140 described with reference to FIGS. 1, 6, and 9. In other cases, memory controller 140-c may be integrated into processor 1010. Processor 1010 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 1010 may perform various functions described herein, including transferring logic values between memory cells 105. Processor 1010 may, for example, be configured to execute computer-readable instructions stored in memory array 100-f to cause device 1005 perform various functions or tasks.

BIOS component 1015 may be a software component that includes a basic input/output system (BIOS) operated as firmware, which may initialize and run various hardware components of system 1000. BIOS component 1015 may also manage data flow between processor 1010 and the various components, e.g., peripheral components 1020, input/output control component 1025, etc. BIOS component 1015 may include a program or software stored in read-only memory (ROM), flash memory, or any other non-volatile memory.

Peripheral component(s) 1020 may be any input or output device, or an interface for such devices, that is integrated into device 1005. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 1025 may manage data communication between processor 1010 and peripheral component(s) 1020, input devices 1035, or output devices 1040. Input/output control component 1025 may also manage peripherals not integrated into device 1005. In some cases, input/output control component 1025 may represent a physical connection or port to the external peripheral.

Input 1035 may represent a device or signal external to device 1005 that provides input to device 1005 or its components. This may include a user interface or interface with or between other devices. In some cases, input 1035 may be a peripheral that interfaces with device 1005 via peripheral component(s) 1020 or may be managed by input/output control component 1025.

Output 1040 may represent a device or signal external to device 1005 configured to receive output from device 1005 or any of its components. Examples of output 1040 may include a display, audio speakers, a printing device, another processor or printed circuit board, etc. In some cases, output 1040 may be a peripheral that interfaces with device 1005 via peripheral component(s) 1020 or may be managed by input/output control component 1025.

The components of memory controller 140-*c*, device 1005, and memory array 100-*f* may be made up of circuitry designed to carry out their functions. This may include various circuit elements, for example, conductive lines, transistors, capacitors, inductors, resistors, amplifiers, or other active or inactive elements, configured to carry out the functions described herein.

Figure 11:
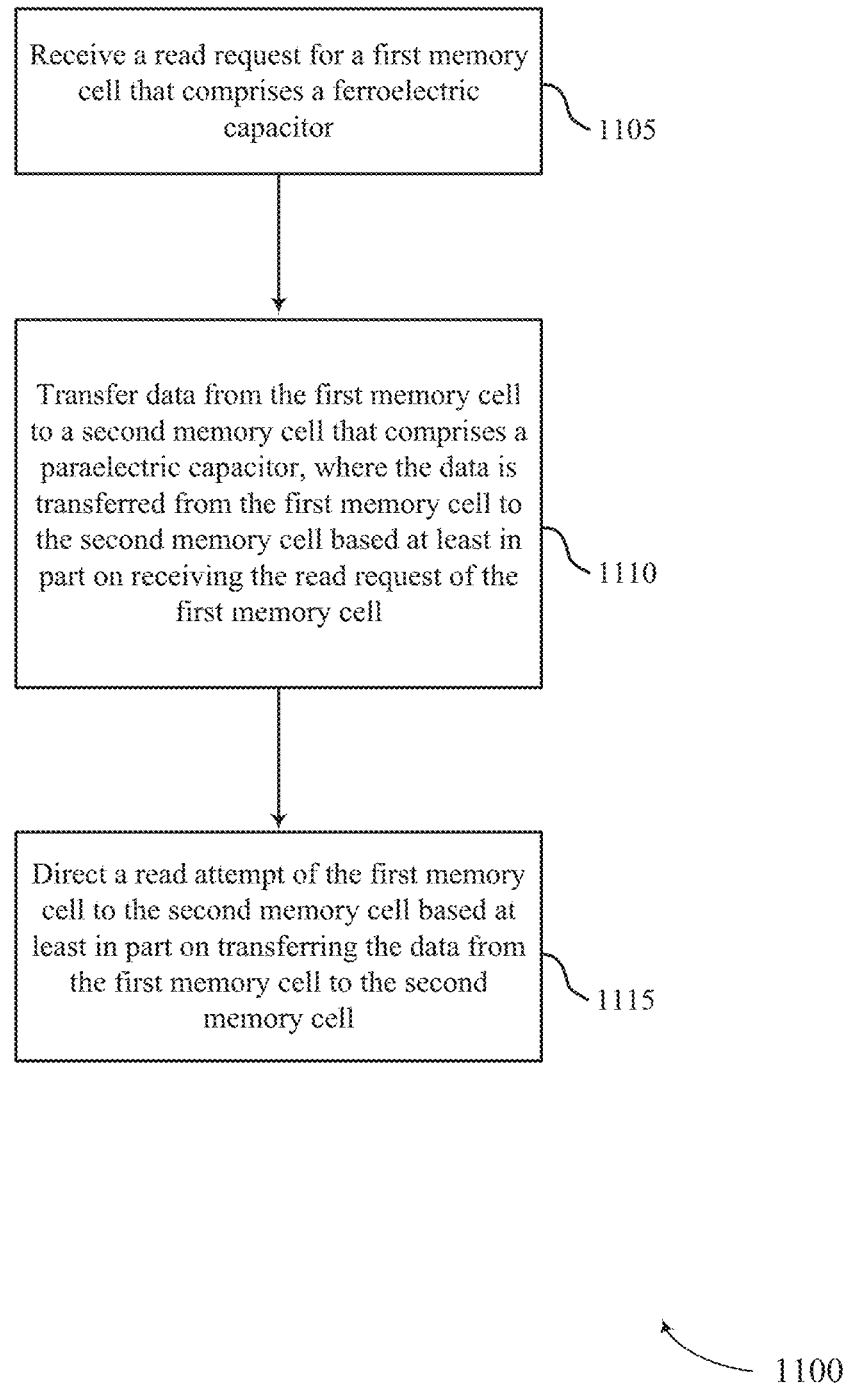
FIGS. 11-13 are flowcharts that illustrate a method or methods for operating a hybrid memory device in accordance with various embodiments of the present disclosure.

FIG. 11 shows a flowchart illustrating a method 1100 for operating a hybrid memory device in accordance with various embodiments of the present disclosure. The operations of method 1100 may be implemented by a memory array 100, as described with reference to FIGS. 1-6, 9, and 10. For example, the operations of method 1100 may be performed by a memory controller 140 as described with reference to FIGS. 1, 6, 9, and 10. In some examples, a memory controller 140 may execute a set of codes to control the functional elements of the memory array 100 to perform the functions described below. Additionally or alternatively, the memory controller 140 may perform features the functions described below using special-purpose hardware.

At block 1105, the method may include receiving a read request for a first memory cell that comprises a ferroelectric capacitor, as described with reference to FIGS. 1, 4, 6, and 9. In certain examples, the operations of block 1105 may be performed or facilitated by the memory controller 140, as described with reference to FIGS. 1, 6, 9, and 10.

At block 1110, the method may include transferring data from the first memory cell to a second memory cell that comprises a paraelectric capacitor, where the data is transferred from the first memory cell to the second memory cell based at least in part on receiving the read request of the first memory cell, as described with reference to FIGS. 1, 4, 6, and 9. In certain examples, the operations of block 1110 may be performed or facilitated by the memory controller 140, as described with reference to FIGS. 1, 6, 9, and 10. In some cases, the operations of block 1110 may be performed without intervention from the host processor 1010, as described with reference to FIG. 10.

At block 1115, the method may include directing a read attempt of the first memory cell to the second memory cell based at least in part on transferring the data from the first memory cell to the second memory cell, as described with reference to FIGS. 1, 4, 6, and 9. In certain examples, the operations of block 1115 may be performed or facilitated by the memory controller 140, as described with reference to FIGS. 1, 6, 9, and 10.

In some cases, the method may include receiving a read request for a third memory cell that comprises a second ferroelectric capacitor, transferring data from the third memory cell to a fourth memory cell that comprises a second paraelectric capacitor, where the data is transferred from the third memory cell to the fourth memory cell based at least in part on receiving the read request of the third memory cell, and directing a read attempt of the third memory cell to the fourth memory cell based at least in part on transferring the data from the third memory cell to the fourth memory cell. In some cases, the first memory cell comprises a plurality of ferroelectric memory cells, and the second memory cell comprises a plurality of paraelectric memory cells.

The memory cells 105 of method 1100 may include recesses or pillars of a cross-point array architecture. The recesses may have an opening less than 100 nm in size. The ferroelectric capacitor may include a material made of hafnium or zirconium or oxygen, or any combination thereof, such as hafnium oxide or zirconia.

Figure 12:
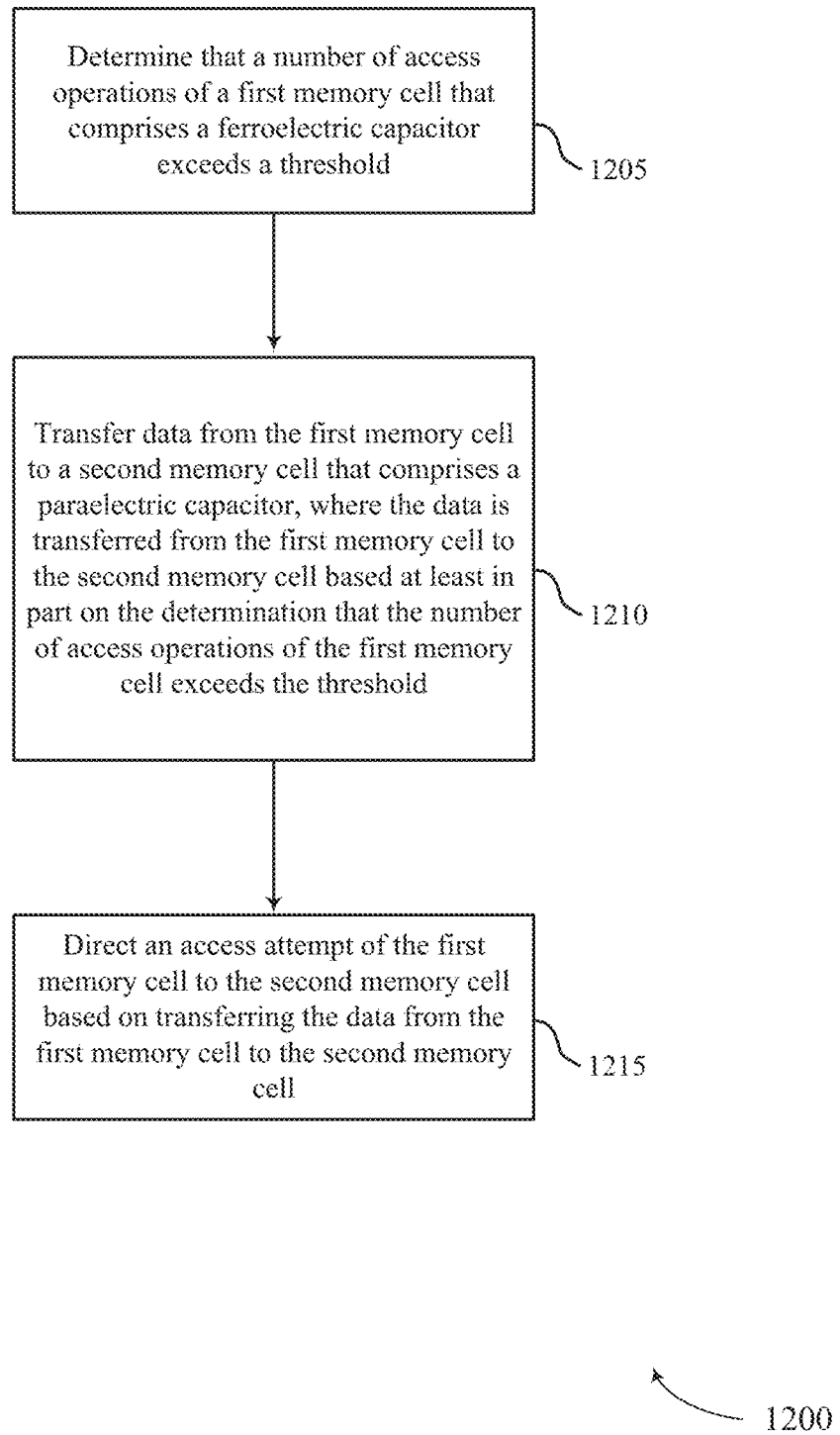

FIG. 12 shows a flowchart illustrating a method 1200 for operating a hybrid memory device in accordance with various embodiments of the present disclosure. The operations of method 1200 may be implemented by a memory array 100, as described with reference to FIGS. 1-6, 9, and 10. For example, the operations of method 1200 may be performed by a memory controller 140 as described with reference to FIGS. 1, 6, 9, and 10. In some examples, a memory controller 140 may execute a set of codes to control the functional elements of the memory array 100 to perform the functions described below. Additionally or alternatively, the memory controller 140 may perform features the functions described below using special-purpose hardware.

At block 1205, the method may include determining that a number of access operations of a first memory cell that comprises a ferroelectric capacitor exceeds a threshold, as described with reference to FIGS. 1, 4, 6, and 9. In some examples, the method may include counting the number of access operations and determining that the counted number of access operations meets or exceeds the threshold. In other examples, the method may include determining that a rate of access operations meets or exceeds a threshold rate. In certain examples, the operations of block 1205 may be performed or facilitated by the memory controller 140, as described with reference to FIGS. 1, 6, 9, and 10, counter 605, or timer 610, as described with reference to FIG. 6.

At block 1210, the method may include transferring data from the first memory cell to a second memory cell that comprises a paraelectric capacitor, where the data is transferred from the first memory cell to the second memory cell based at least in part on the determination that the number of access operations of the first memory cell exceeds the threshold, as described with reference to FIGS. 1, 4, 6, and 9. In certain examples, the operations of block 1210 may be performed or facilitated by the memory controller 140, as described with reference to FIGS. 1, 6, 9, and 10. In some cases, the operations of block 1210 may be performed without intervention from the host processor 1010, as described with reference to FIG. 10.

At block 1215, the method may include directing an access attempt of the first memory cell to the second memory cell based on transferring the data from the first memory cell to the second memory cell, as described with reference to FIGS. 1, 4, 6, and 9. In certain examples, the operations of block 1215 may be performed or facilitated by the memory controller 140, as described with reference to FIGS. 1, 6, 9, and 10.

Figure 13:
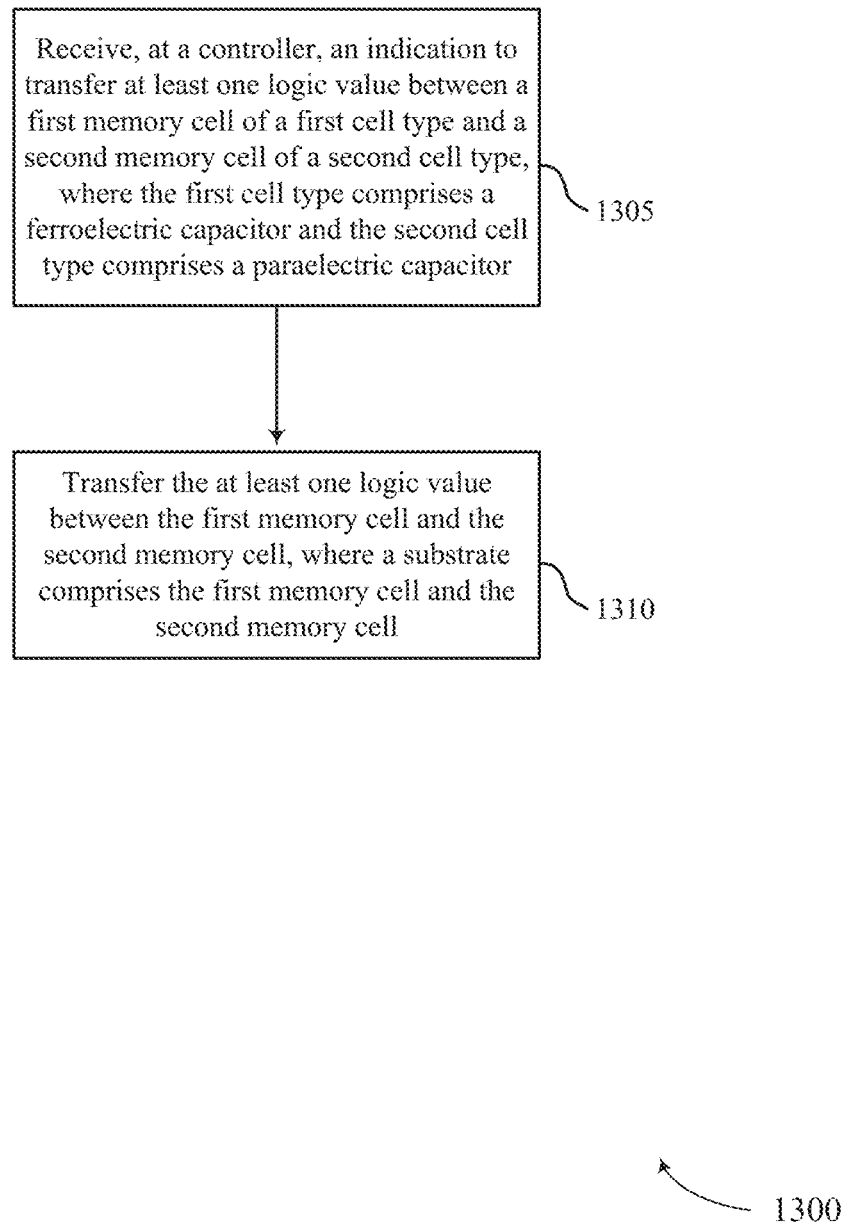

FIG. 13 shows a flowchart illustrating a method 1300 for operating a hybrid memory device in accordance with various embodiments of the present disclosure. The operations of method 1300 may be implemented by a memory array 100, as described with reference to FIGS. 1-6, 9, and 10. For example, the operations of method 1300 may be performed by a memory controller 140 as described with reference to FIGS. 1, 6, 9, and 10. In some examples, a memory controller 140 may execute a set of codes to control the functional elements of the memory array 100 to perform the functions described below. Additionally or alternatively, the memory controller 140 may perform features the functions described below using special-purpose hardware.

At block 1305, the method may include receiving, at a controller, an indication to transfer at least one logic value from a first memory cell of a first cell type to a second memory cell of a second cell type, or to the first memory cell of the first from the second memory cell of the second type, where the first cell type comprises a ferroelectric capacitor and the second cell type comprises a paraelectric or linear dielectric capacitor, as described with reference to FIGS. 1, 4, 6, and 9. For example, a logic value of a ferroelectric memory cell may be determined, and a memory cell with a paraelectric capacitor may be written with that value in order to provide some redundancy for or offloading from the ferroelectric memory cell. Similarly, a logic value of a memory cell with a paraelectric capacitor may be determined, and a ferroelectric memory cell may be written with that value in order to provide some redundancy for or offloading from the memory cell with the paraelectric capacitor. The method may thus include an indication to transfer at least one logic value between the first memory cell of the first cell type and the second memory cell of the second cell type, wherein the first cell type comprises a ferroelectric capacitor and the second cell type comprises a paraelectric or linear dielectric capacitor. In some examples, the indication may be received from a component external to the substrate. In certain examples, the operations of block 1305 may be performed or facilitated by the memory controller 140, as described with reference to FIGS. 1, 6, 9, and 10.

At block 1310, the method may include transferring the at least one logic value between the first memory cell and the second memory cell, where a substrate comprises the first memory cell and the second memory cell, as described with reference to FIGS. 1, 4, 6, and 9. Transferring the at least one logic value may include reading the at least one logic value stored in the first memory cell and writing the at least one logic value to the second memory cell. Or, transferring the at least one logic value may include reading the at least one logic value stored in the second memory cell and writing the at least one logic value to the first memory cell. In certain examples, the operations of block 1310 may be performed or facilitated by the memory controller 140, as described with reference to FIGS. 1, 6, 9, and 10.

In some examples of the method, the substrate may have a memory array that includes the first memory cell and the second memory cell. Or, the substrate may have a first memory array comprising memory cells of the first cell type and a second memory array comprising memory cells of the second cell type. In some cases, the first cell type comprises a non-volatile memory cell and the second cell type comprises a volatile memory cell. In other cases, the first cell type comprises a volatile memory cell and the second cell type comprises a non-volatile memory cell.

The memory cells 105 of method 1300 may include recesses or pillars of a cross-point array architecture. The recesses may have an opening less than 100 nm in size. The ferroelectric capacitor may include a material made of hafnium or zirconium or oxygen, or any combination thereof, such as hafnium oxide or zirconia.

In some examples, a quantity of memory cells of the first memory array may be greater than a quantity of memory cells of the second memory array, and the transferring the at least one logic value includes transferring a subset of logic values between the first and second memory arrays. In another example, a quantity of memory cells of the first memory array may be less than or equal to a quantity of memory cells of the second memory array, and transferring the at least one logic value may include transferring all logic values stored in the second memory array to the first memory array based at least in part on a power interruption to the second memory array.

In some examples of the method, the indication to transfer the at least one logic value between the first memory cell and the second memory cell is based on a device comprising the memory device powering down.

Figure 14:
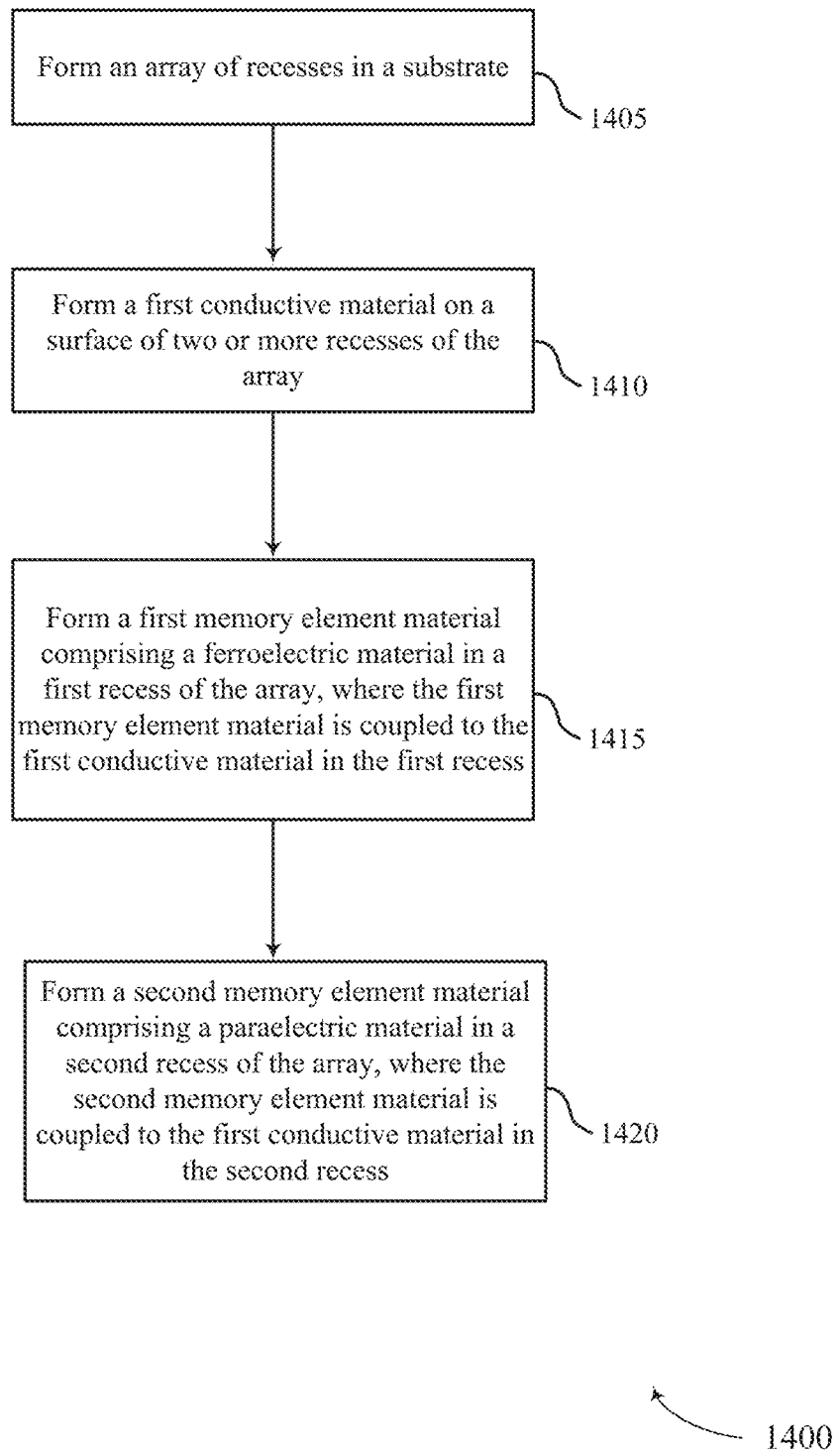
FIGS. 14-15 are flowcharts that illustrate a method or methods for forming a hybrid memory device in accordance with various embodiments of the present disclosure.

FIG. 14 shows a flowchart illustrating a method 1400 to form a hybrid memory device in accordance with various embodiments of the present disclosure. The formation methods may include those described with reference to FIGS. 7 and 8. For example, materials or components may be formed through various combinations of material deposition and removal. In some cases, material formation or removal may include one or more photolithography steps not denoted explicitly.

At block 1405, the method may include forming an array of recesses in a substrate, as described with reference to FIG. 7. In some examples, a largest dimension of an opening of each recess of the array is less than 100 nanometers.

At block 1410, the method may include forming a first conductive material on a surface of two or more recesses of the array, as described with reference to FIG. 7.

At block 1415, the method may include forming a first memory element material comprising a ferroelectric material in a first recess of the array, wherein the first memory element material is coupled to the first conductive material in the first recess, as described with reference to FIG. 7. In some examples, the ferroelectric material may be a compound that includes hafnium or zirconium or oxygen, or any combination thereof, for example, hafnium oxide or zirconia.

At block 1420, the method may include forming a second memory element material comprising a paraelectric material in a second recess of the array, wherein the second memory element material is coupled to the first conductive material in the second recess, as described with reference to FIG. 7.

The method may also include forming a second conductive material coupled to the first memory element material of the first recess and forming a third conductive material coupled to the second memory element material of the second recess.

Figure 15:
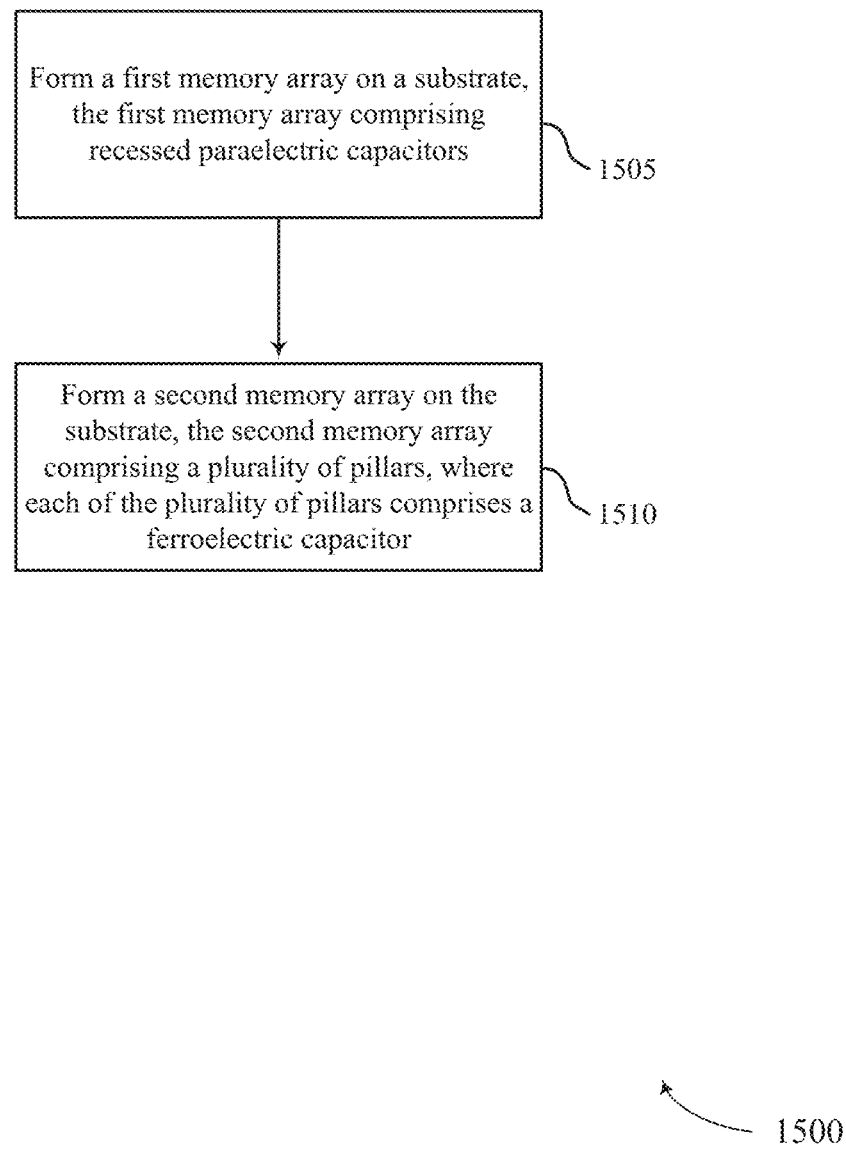

FIG. 15 shows a flowchart illustrating a method 1500 to form a hybrid memory device in accordance with various embodiments of the present disclosure. The formation methods may include those described with reference to FIGS. 7 and 8. For example, materials or components may be formed through various combinations of material deposition and removal. In some cases, material formation or removal may include one or more photolithography steps not denoted explicitly.

At block 1505, the method may include forming a first memory array on a substrate, the first memory array comprising recessed paraelectric capacitors, as described with reference to FIG. 8. In some examples, the recessed paraelectric capacitors comprise recesses in the substrate, where a largest dimension of an opening of each recess of the array is less than 100 nanometers.

At block 1510, the method may include forming a second memory array on the substrate, the second memory array comprising a plurality of pillars, where each of the plurality of pillars comprises a ferroelectric capacitor, as described with reference to FIG. 8.

Thus, methods 1100, 1200, 1300, 1400, and 1500 may provide for forming and operating a hybrid memory device. It should be noted that methods 1100, 1200, 1300, 1400, and 1500 describe possible implementations, and the operations and steps may be rearranged or otherwise modified such that other implementations are possible. In some examples, features from two or more of the methods 1100, 1200, 1300, 1400, and 1500 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method of forming a memory apparatus, comprising:
   forming an array of recesses in a substrate;
   forming a first conductive material on a surface of two or more recesses of the array;
   forming a first mask material over a second recess before forming a first memory element material; and
   forming the first memory element material comprising a ferroelectric material in a first recess of the array, wherein the first memory element material is coupled to the first conductive material in the first recess;
   forming a second mask material over the first recess before forming a second memory element material; and
   forming the second memory element material comprising a paraelectric material in the second recess of the array, wherein the second memory element material is coupled to the first conductive material in the second recess.

2. The method of claim 1, further comprising:
   forming a second conductive material coupled to the first memory element material of the first recess; and
   forming a third conductive material coupled to the second memory element material of the second recess.

3. The method of claim 2, further comprising:
   forming a ferroelectric capacitor in the first recess, the ferroelectric capacitor comprising a first electrode, an insulator, and a second electrode, wherein the first conductive material comprises the first electrode, the ferroelectric material comprises the insulator, and the second conductive material comprises the second electrode.

4. The method of claim 2, further comprising:
   forming a paraelectric capacitor in the second recess, the paraelectric capacitor comprising a first electrode, the paraelectric material, and a second electrode, wherein the first conductive material comprises the first electrode and the third conductive material comprises the second electrode.

5. The method of claim 1, further comprising:
   forming a volatile memory cell in the first recess; and
   forming a non-volatile memory cell in the second recess.

6. The method of claim 5, further comprising:
   forming a word line in the substrate, wherein at least one of the volatile memory cell or the non-volatile memory cell is in electronic communication with the word line.

7. The method of claim 1, wherein forming the array of recesses in the substrate comprises:
   etching the substrate to form the array of recesses.

8. The method of claim 1, wherein a largest dimension of an opening of a recess of the array of recesses is less than 100 nanometers.

9. A method of forming a memory apparatus, comprising:
   forming a first memory array on a substrate, the first memory array comprising recessed paraelectric capacitors;
   forming a first mask material covering a second recess of an array of recesses before forming a first memory element material; and
   forming a second mask material covering a first recess of the array of recesses before forming a second memory element material; and
   forming a second memory array on the substrate, the second memory array comprising a plurality of pillars, wherein each of the plurality of pillars comprise a ferroelectric capacitor.

10. The method of claim 9, further comprising:
    forming the array of recesses in a dielectric material, wherein the array of recesses comprises at least the first recess and second recess, the first recess being associated with the first memory array and the second recess being associated with the first memory array;
    forming a first conductive material on a surface of the first recess and a surface of the second recess;
    forming the first memory element material over the first recess and the first mask material, wherein the first memory element material is coupled to the first conductive material in the first recess;
    removing the first mask material from the second recess;
    forming the second memory element material over the second recess and the second mask material, the second memory element material being different from the first memory element material, wherein the second memory element material is coupled to the first conductive material in the second recess; and
    removing the second mask material from the first recess.

11. The method of claim 10, further comprising:
    forming, before removing the first mask material, a second conductive material over the first memory element material and the first mask material; and forming, before removing the second mask material, a third conductive material over the second memory element material and the second mask material.

12. The method of claim 11, further comprising:
forming a first type of capacitor in the first recess, wherein the first conductive material comprises a bottom electrode of the first type of capacitor, the first memory element material comprises an insulator of the first type of capacitor, and the second conductive material comprises a top electrode of the first type of capacitor.

13. The method of claim 12, wherein the first memory element material comprises a ferroelectric material and the first type of capacitor is the ferroelectric capacitor.

14. The method of claim 11, further comprising:
forming a second type of capacitor in the second recess, wherein the first conductive material comprises a bottom electrode of the second type of capacitor and the third conductive material comprises a top electrode of the second type of capacitor.

15. The method of claim 14, wherein the second memory element material comprises a paraelectric material and the second type of capacitor is a recessed paraelectric capacitor.

16. The method of claim 10, further comprising:
forming a word line in the dielectric material, wherein at least one of the first memory element material or the second memory element material is in electronic communication with the word line.

17. A memory apparatus, comprising:
a substrate;
an array of recesses formed in a dielectric material on the substrate;
a first conductive material formed on a first surface, a second surface, and a third surface of two or more recesses of the array;
a first memory cell formed in a first recess of the two or more recesses of the array and comprising a ferroelectric capacitor, wherein the first memory cell is coupled with the first conductive material in the first recess;
a second memory cell formed in a second recess of the two or more recesses of the array and comprising a paraelectric material, wherein the second memory cell is coupled with the first conductive material in the second recess; and
a second conductive material formed on a first sidewall surface, a second sidewall surface, and a bottom surface of the paraelectric material of the second memory cell.

18. The memory apparatus of claim 17, wherein the first memory cell is a volatile memory cell and the second memory cell is a non-volatile memory cell.

19. The memory apparatus of claim 17, further comprising:
a word line buried in the substrate, wherein at least one of the first memory cell or the second memory cell is in electronic communication with the word line.

* * * * *